United States Patent
Tanaka

(10) Patent No.: US 10,850,975 B2
(45) Date of Patent: Dec. 1, 2020

(54) PHYSICAL QUANTITY SENSOR MANUFACTURING METHOD, PHYSICAL QUANTITY SENSOR, ELECTRONIC DEVICE, AND VEHICLE

(71) Applicant: Seiko Epson Corporation, Tokyo (JP)

(72) Inventor: Satoru Tanaka, Chino (JP)

(73) Assignee: Seiko Epson Corporation (JP)

( * ) Notice: Subject to any disclaimer, the term of this patent is extended or adjusted under 35 U.S.C. 154(b) by 389 days.

(21) Appl. No.: 15/900,088

(22) Filed: Feb. 20, 2018

(65) Prior Publication Data

US 2018/0273375 A1 Sep. 27, 2018

(30) Foreign Application Priority Data

Mar. 27, 2017 (JP) ................................. 2017-061700

(51) Int. Cl.
*H01L 21/00* (2006.01)
*B81C 1/00* (2006.01)
(Continued)

(52) U.S. Cl.
CPC ...... *B81C 1/00166* (2013.01); *B60R 16/0231* (2013.01); *B60R 25/24* (2013.01);
(Continued)

(58) Field of Classification Search
CPC ........ B81C 1/00166; B81C 2201/0133; B60R 16/0231; B60R 25/24; B81B 3/0008;
(Continued)

(56) References Cited

U.S. PATENT DOCUMENTS

2003/0115960 A1 6/2003 Franz et al.
2005/0139942 A1 6/2005 Eskridge et al.
(Continued)

FOREIGN PATENT DOCUMENTS

| JP | 2003-519384 A | 6/2003 |
|---|---|---|
| JP | 2015-031644 A | 2/2015 |
| JP | 2015-031645 A | 2/2015 |
| JP | 5852437 B2 | 2/2016 |
| JP | 2016-044979 A | 4/2016 |

OTHER PUBLICATIONS

Extended European Search Report for Patent Application No. EP 18163897.4 dated Jun. 28, 2018 (6 pages).

*Primary Examiner* — Richard A Booth
(74) *Attorney, Agent, or Firm* — Harness, Dickey & Pierce, P.L.C.

(57) ABSTRACT

A manufacturing method of a physical quantity sensor includes forming first and second fixed electrodes, and a dummy electrode on a substrate; and a movable body forming. The electrode forming includes forming a first mask layer on the substrate, forming a first electrode material layer by forming a first conductive layer on the substrate and the first mask layer, forming a second conductive layer on the substrate and the first electrode material layer, forming a second mask layer by forming a mask material layer on the second conductive layer, and removing a part of a section of the mask material layer not overlapping the first electrode material layer in plan view, and forming a second electrode material layer by etching the second conductive layer, with the second mask layer as a mask such that the second conductive layer is provided on the first electrode material layer and on the substrate.

5 Claims, 26 Drawing Sheets

(51) Int. Cl.
  *B81B 3/00* (2006.01)
  *B60R 25/24* (2013.01)
  *B60R 16/023* (2006.01)
  *G01P 15/125* (2006.01)
  *G01P 15/08* (2006.01)

(52) U.S. Cl.
  CPC .......... *B81B 3/0008* (2013.01); *G01P 15/125* (2013.01); *B81B 2201/0235* (2013.01); *B81B 2201/0242* (2013.01); *B81B 2203/04* (2013.01); *B81B 2207/07* (2013.01); *B81C 2201/0133* (2013.01); *B81C 2201/0187* (2013.01); *G01P 2015/0831* (2013.01)

(58) Field of Classification Search
  CPC .... B81B 2201/0235; B81B 2201/0242; B81B 2203/04; B81B 2207/07; B81B 2201/0187; G01P 2015/0831
  See application file for complete search history.

(56) References Cited

U.S. PATENT DOCUMENTS

| | | |
|---|---|---|
| 2012/0186347 A1 | 7/2012 | McNeil |
| 2013/0042684 A1* | 2/2013 | Yoda ..................... G01P 15/125 |
| | | 73/514.01 |
| 2015/0013458 A1* | 1/2015 | Tanaka .................. B81B 3/0051 |
| | | 73/514.35 |
| 2015/0040667 A1 | 2/2015 | Tanaka |
| 2015/0336790 A1 | 11/2015 | Geen et al. |
| 2016/0047839 A1 | 2/2016 | Tanaka |
| 2016/0130135 A1* | 5/2016 | Kamisuki ........... B81C 1/00269 |
| | | 257/415 |
| 2016/0146851 A1* | 5/2016 | Kamisuki ............. G01P 15/125 |
| | | 73/514.32 |
| 2016/0209442 A9 | 7/2016 | Tanaka |
| 2017/0088413 A1* | 3/2017 | Tanaka ..................... B81B 3/001 |
| 2017/0233246 A1* | 8/2017 | Kanamaru ........... G01C 19/574 |
| | | 257/417 |
| 2019/0256349 A1* | 8/2019 | Kurokawa .............. H01L 24/29 |

\* cited by examiner

PHYSICAL QUANTITY SENSOR MANUFACTURING METHOD, PHYSICAL QUANTITY SENSOR, ELECTRONIC DEVICE, AND VEHICLE

BACKGROUND

1. Technical Field

The present invention relates to a physical quantity sensor manufacturing method, a physical quantity sensor, an electronic device, and a vehicle.

2. Related Art

In recent years, a physical quantity sensor measuring a physical quantity such as an acceleration has been developed using, for example, a silicon micro electro mechanical systems (MEMS) technique.

For example, JP-A-2016-44979 discloses a physical quantity sensor that includes a first fixed electrode, a second fixed electrode, a movable body, a first pad electrically connected to the movable body, a second pad electrically connected to the second fixed electrode, and a third pad electrically connected to the first fixed electrode, and measures an acceleration based on a first capacitance detected by using the first pad and the second pad, and a second capacitance detected using the first pad and by the third pad. Further, JP-A-2016-44979 discloses a dummy electrode is provided in order to prevent the occurrence of sticking and reduce a capacitance offset.

However, considering the reliability of the first fixed electrode, the second fixed electrode, and the dummy electrode and the signal-noise ratio (S/N) ratio of the physical quantity sensor, the materials of the first fixed electrode, the second fixed electrode, and the dummy electrode are preferably platinum, for example. Since platinum has poor reactivity, it is difficult to pattern it by etching, and it is patterned by, for example, a lift-off method.

In the physical quantity sensor as described above, in order to reduce the capacitance offset, for example, the distance between the first fixed electrode and the dummy electrode may be reduced in some cases.

However, it is more difficult to perform microfabrication in the lift-off method than a case of directly etching the conductive layer. Therefore, in a case where the first fixed electrode and the dummy electrode are formed by a lift-off method, there is a problem that it is difficult to sufficiently reduce the distance between the first fixed electrode and the dummy electrode, and it is difficult to reduce the capacitance offset.

SUMMARY

An advantage of some aspects of the invention is to provide a physical quantity sensor manufacturing method capable of reducing capacitance offset.

Another advantage of some aspects of the invention is to provide a physical quantity sensor capable of reducing capacitance offset.

Another advantage of some aspects of the invention is to provide an electronic device including the physical quantity sensor.

Another advantage of some aspects of the invention is to provide a vehicle including the physical quantity sensor.

The invention can be implemented as the following forms or application examples.

Application Example 1

A physical quantity sensor according to this application example includes forming a first fixed electrode, a second fixed electrode, and a dummy electrode on a substrate; forming a movable body which overlaps with the first fixed electrode and the second fixed electrode in plan view, has the same potential as the dummy electrode, and displaces in a direction intersecting with a main surface of the substrate according to a physical quantity, and in the electrode forming, the first fixed electrode and the dummy electrode are formed adjacent to each other, the electrode forming includes forming a first mask layer on the substrate, forming a first electrode material layer, by forming a first conductive layer on the substrate and on the first mask layer, and removing the first mask layer; forming a second conductive layer on the substrate and on the first electrode material layer; forming a second mask layer by forming a mask material layer on the second conductive layer, and removing a part of the section of the mask material layer not overlapping the first electrode material layer in plan view; forming a second electrode material layer by etching the second conductive layer by using the second mask layer as a mask such that the second conductive layer is provided on the first electrode material layer and on the substrate.

In such a physical quantity sensor manufacturing method, the second electrode material layer constituting the first fixed electrode and the second electrode material layer constituting the first dummy electrode can be provided between the first electrode material layer constituting the first fixed electrode and the first electrode material layer constituting the first dummy electrode.

Further, in such a physical quantity sensor manufacturing method, it is possible to make the distance between the second electrode material layer constituting the first fixed electrode and the second electrode material layer constituting the first dummy electrode smaller than the distance between the first electrode material layer constituting the first fixed electrode and the first electrode material layer constituting the first dummy electrode.

Therefore, in such a physical quantity sensor manufacturing method, it is possible to reduce a distance between the first fixed electrode and the first dummy electrode. Therefore, in such a physical quantity sensor manufacturing method, the capacitance formed by the first fixed electrode and the first dummy electrode can be adjusted with high accuracy, and the capacitance offset can be reduced.

Application Example 2

In the physical quantity sensor manufacturing method according to the application example, in the electrode forming, the first fixed electrode and the dummy electrode may be formed to be adjacent to each other, and the electrode forming may include forming an insulating layer between the first fixed electrode and the dummy electrode.

In such a physical quantity sensor manufacturing method, short circuit between the first fixed electrode and the first dummy electrode can be reduced.

Application Example 3

In the physical quantity sensor manufacturing method according to the application example, the material of the first electrode material layer may be platinum.

In such a physical quantity sensor manufacturing method, it is possible to manufacture a physical quantity sensor that can have high reliability.

Application Example 4

In the physical quantity sensor manufacturing method according to the application example, the material of the second electrode material layer may be titanium tungsten.

In such a physical quantity sensor manufacturing method, it is possible to process the conductive layer to be the second electrode material layer by direct etching.

Application Example 5

The physical quantity sensor manufacturing method according to the application example may include forming an adhesive layer on the substrate before the electrode forming, and in the forming the first electrode material layer, the first conductive layer may be formed on the adhesive layer.

In such a physical quantity sensor manufacturing method, it is possible to improve adhesion between the substrate and the first electrode material layer.

Application Example 6

A physical quantity sensor according to this application example includes a substrate; a movable body displacing in a direction intersecting a main surface of the substrate according to a physical quantity; a first fixed electrode and a second fixed electrode which are fixed to the substrate and overlapping the movable body in plan view; an electrode that is fixed to the substrate and provided adjacent to the first fixed electrode, and has the same potential as the movable body, the first fixed electrode and the dummy electrode include a first electrode material layer provided on the substrate, and a second electrode material layer provided on the substrate and on the first electrode material layer, the second electrode material layer constituting the first fixed electrode and the second electrode material layer constituting the dummy electrode are provided between the first electrode material layer constituting the first fixed electrode and the first electrode material layer constituting the dummy electrode, and a distance between the second electrode material layer constituting the first fixed electrode and the second electrode material layer constituting the dummy electrode is smaller than a distance between the first electrode material layer constituting the first fixed electrode and the first electrode material layer constituting the dummy electrode.

In such a physical quantity sensor, it is possible to reduce a distance between the first fixed electrode and the first dummy electrode.

Therefore, in such a physical quantity sensor, the capacitance formed by the first fixed electrode and the first dummy electrode can be adjusted with high accuracy, and the capacitance offset can be reduced.

Application Example 7

The physical quantity sensor according to the application example may include an insulating layer between the first fixed electrode and the dummy electrode.

In such a physical quantity sensor, short circuit between the first fixed electrode and the first dummy electrode can be reduced.

Application Example 8

In the physical quantity sensor according to the application example, the material of the first electrode material layer may be platinum.

Such a physical quantity sensor can have high reliability.

Application Example 9

In the physical quantity sensor according to the application example, the material of the second electrode material layer may be titanium tungsten.

In such a physical quantity sensor, it is possible to process the conductive layer to be the second electrode material layer by direct etching.

Application Example 10

The physical quantity sensor according to the application example may include an adhesive layer provided between the substrate and the first electrode material layer to bring the substrate and the first electrode material layer into close contact with each other may be included.

In such a physical quantity sensor, it is possible to improve adhesion between the substrate and the first electrode material layer.

A portable electronic device according to this application example includes the physical quantity sensor according to the application example, an arithmetic processing unit that performs an arithmetic process based on an output signal from the physical quantity sensor, a communication unit that performs data communication with an outside, an operation unit that transmits an operation signal to the arithmetic processing unit, and a display unit that displays information according to control of the arithmetic processing unit.

The portable electronic device according to the application example may include a GPS receiver, and measures a movement distance and a movement trajectory of a user.

Application Example 11

An electronic device according to this application example includes the physical quantity sensor according to the application example.

Such an electronic device can include the physical quantity sensor according to the application example.

Application Example 12

A vehicle according to this application example includes the physical quantity sensor according to this application example.

Such a vehicle can include the physical quantity sensor according to this application example.

The vehicle according to this application example may include at least one system of an engine system, a brake system, and a keyless entry system, and a controller that controls the system, based on an output signal from the physical quantity sensor.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. In addition, the embodiments to be described below do not unfairly limit the contents of the invention described in the appended claims. Further, not all of the configurations to be described below are necessarily essential constituent elements of the invention.

1. First Embodiment 1.1. Physical Quantity Sensor

Figure 1:
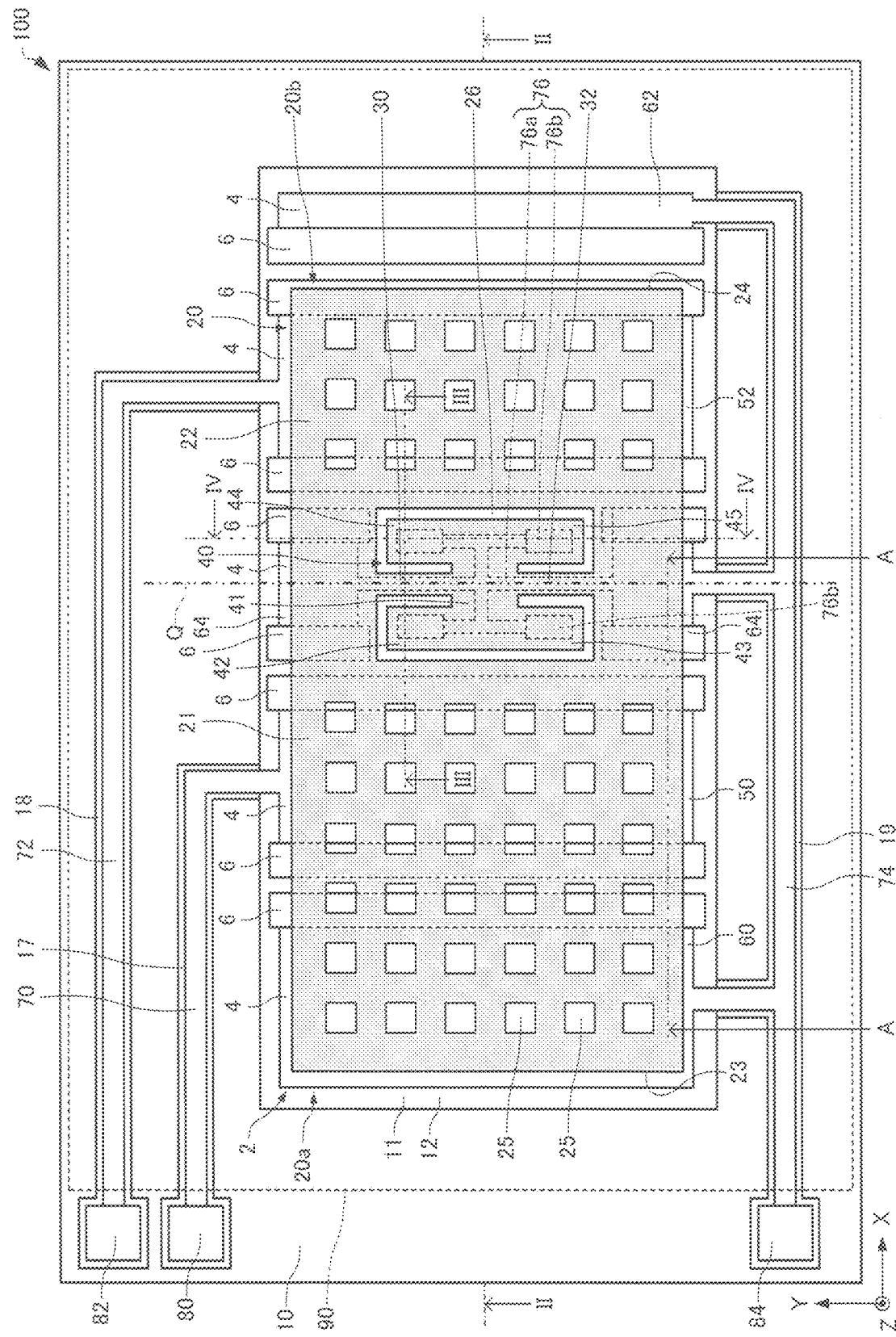
FIG. 1 is a plan view schematically illustrating a physical quantity sensor according to a first embodiment.
Figure 2:
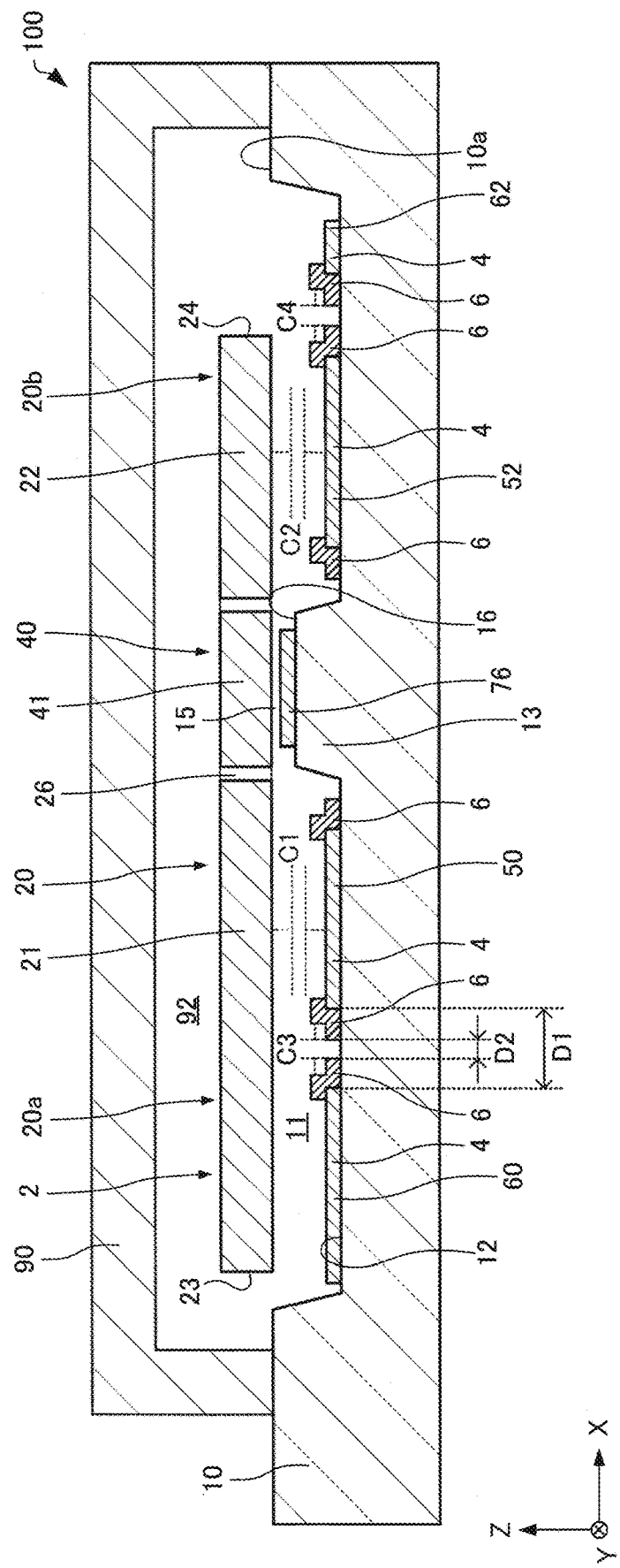
FIG. 2 is a cross-sectional view schematically illustrating the physical quantity sensor according to the first embodiment.
Figure 3:
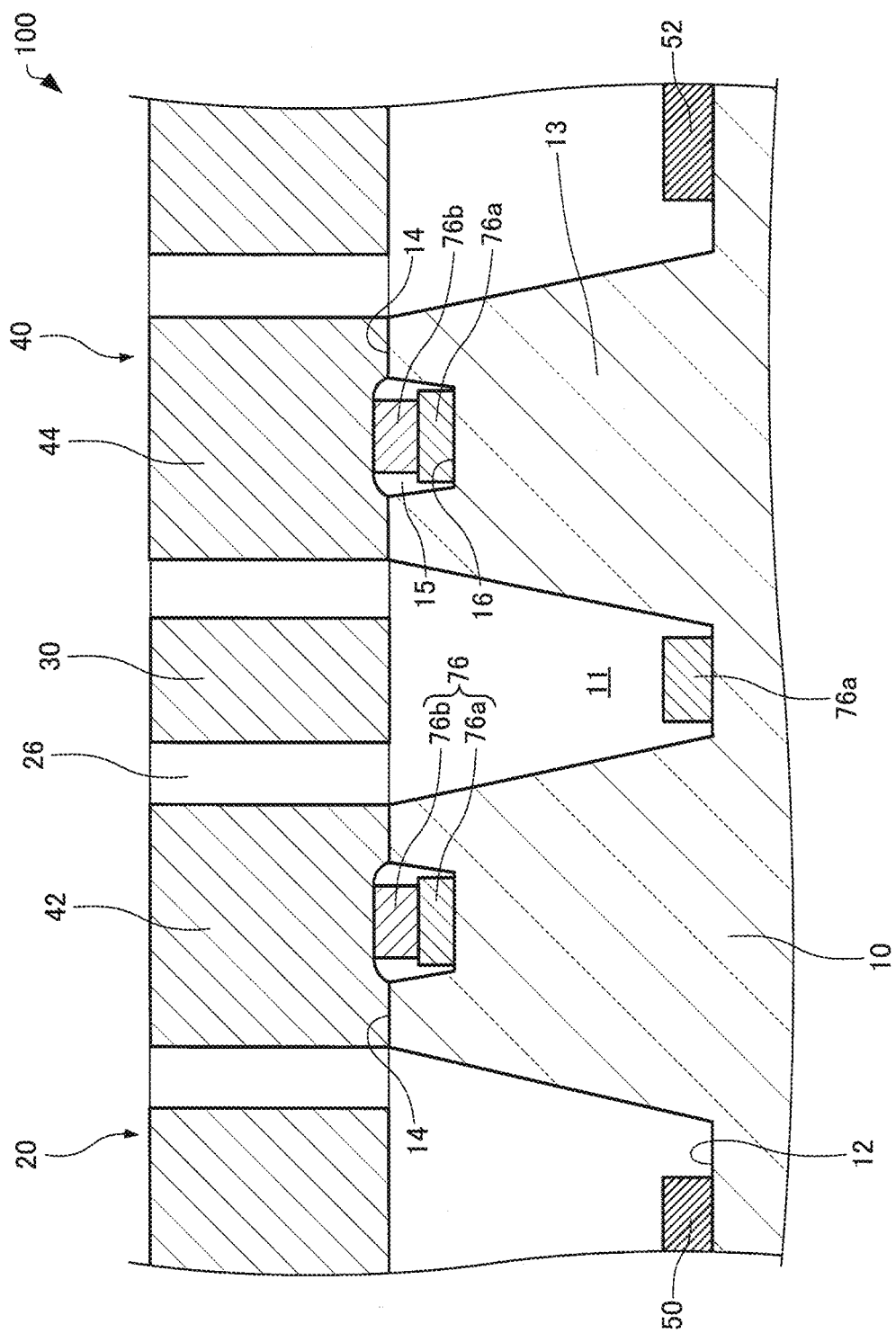
FIG. 3 is a cross-sectional view schematically illustrating the physical quantity sensor according to the first embodiment.
Figure 4:
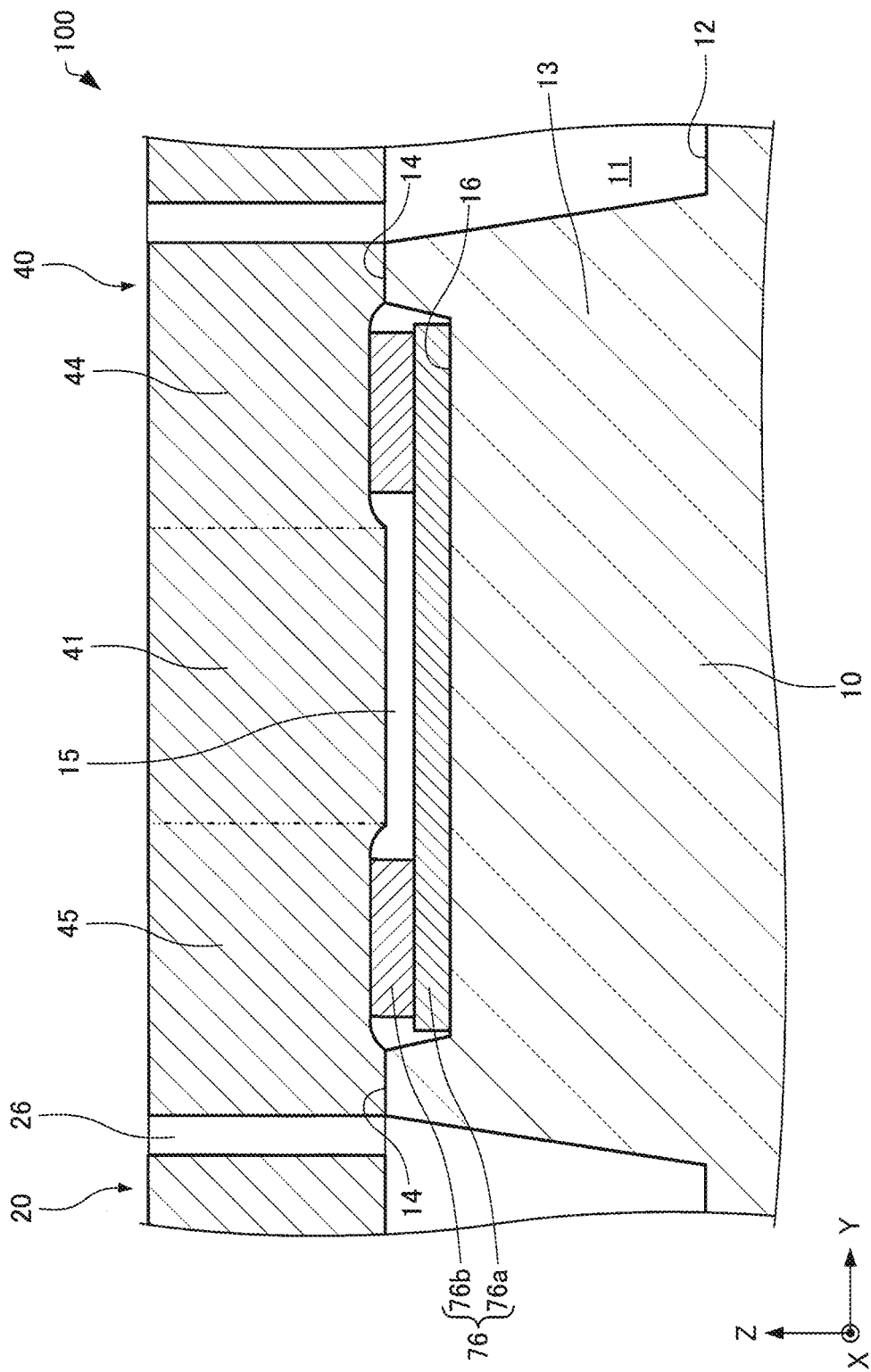
FIG. 4 is a cross-sectional view schematically illustrating the physical quantity sensor according to the first embodiment.

First, a physical quantity sensor according to a first embodiment will be described with reference to the drawings. FIG. 1 is a plan view schematically illustrating a physical quantity sensor 100 according to the first embodiment. FIG. 2 is a cross-sectional view taken along the line II-II of FIG. 1 schematically illustrating the physical quantity sensor 100 according to the first embodiment. FIG. 3 is a cross-sectional view taken along the line III-III of FIG. 1 schematically illustrating the physical quantity sensor 100 according to the first embodiment. FIG. 4 is a cross-sectional view taken along the line IV-IV in FIG. 1 schematically illustrating the physical quantity sensor 100 according to the first embodiment. In FIG. 1 to FIG. 4, the X axis, the Y axis, and the Z axis are illustrated as three axes orthogonal to each other.

As illustrated in FIG. 1 to FIG. 4, the physical quantity sensor 100 includes a substrate 10, a movable body 20, a first connecting portion 30, a second connecting portion 32, a support portion 40, a first fixed electrode 50, a second fixed electrode 52, a first dummy electrode 60, a second dummy electrode 62, a third dummy electrode 64, a first wiring 70, a second wiring 72, a third wiring 74, a fourth wiring 76, a first pad 80, a second pad 82, a third pad 84, and a lid body 90. For the sake of convenience, FIG. 1 shows the lid body 90 in perspective. In FIGS. 3 and 4, the illustration of the lid body 90 is omitted.

In the following, an example will be described in which the physical quantity sensor 100 is an acceleration sensor (capacitive MEMS acceleration sensor) that measures an acceleration in the vertical direction (Z-axis direction).

The material of the substrate 10 is, for example, an insulating material such as glass. For example, since the substrate 10 is made of an insulating material such as glass and the movable body 20 is made of a semiconductor material such as silicon, it is possible to electrically insulate them from each other easily, and reduce the sensor structure.

On the substrate 10, a recessed portion 11 is formed. The movable body 20 and the connecting portions 30 and 32 are provided above the recessed portion 11 through gaps. In the example illustrated in FIG. 1, the planar shape (the shape seen from the Z-axis direction) of the recessed portion 11 is a rectangle.

The substrate 10 includes a post portion 13 on the bottom surface (the surface of the substrate 10 defining the recessed portion 11) 12 of the recessed portion 11. The post portion 13 protrudes upward (+Z-axis direction) than the bottom surface 12. As illustrated in FIG. 3 and FIG. 4, the height of the post portion 13 (the distance between the top surface 14 and the bottom surface 12 of the post portion 13) and the depth of the recessed portion 11 are equal, for example. The top surface 14 of the post portion 13 is bonded to the support portion 40. A hollow 15 is formed on the top surface 14 of the post portion 13. A fourth wiring 76 is provided on the bottom surface 16 of the hollow 15 (the surface of the post portion 13 defining the hollow 15).

In the example illustrated in FIG. 2 to FIG. 4, the side surface of the recessed portion 11 (the side surface of the substrate 10 defining the recessed portion 11) and the side surface of the post portion 13 are inclined with respect to the bottom surface 12 of the recessed portion 11, but may be perpendicular to the bottom surface 12.

The substrate 10 is provided with groove portions 17, 18, and 19 in which wirings 70, 72, and 74 are disposed respectively.

The movable body 20 is displaced in a direction (for example, an orthogonal direction (Z-axis direction)) intersecting with the main surface (top surface) 10a of the substrate 10 according to a physical quantity (for example, an acceleration). Specifically, when an acceleration in the vertical direction (Z-axis direction) is applied, the movable body 20 swings like the seesaw, with the support axis Q determined by the connecting portions 30 and 32 as the rotation axis (swing axis). The support axis Q is, for example, parallel to the Y axis. In the example illustrated in FIG. 1, the planar shape of the movable body 20 is a rectangle. The thickness (size in the Z-axis direction) of the movable body 20 is, for example, constant.

The movable body 20 includes a first seesaw piece 20a and a second seesaw piece 20b. The first seesaw piece 20a is positioned on one side (on the −X-axis direction side in the illustrated example) in a direction intersecting with the extending direction of the support axis Q in plan view (viewed from the Z-axis direction). In plan view, the second seesaw piece 20b is positioned on the other side (on the +X-axis direction side in the illustrated example) in a direction intersecting with the extending direction of the support axis Q.

When an acceleration (for example, a gravitational acceleration) in the vertical direction is applied to the movable body 20, a rotational moment (moment of force) is generated in each of the first seesaw piece 20a and the second seesaw piece 20b. Here, in a case where the rotational moment of the first seesaw piece 20a (for example, the counterclockwise rotational moment) and the rotational moment of the second seesaw piece 20b (for example, the clockwise rotational moment) are balanced, the inclination of the movable body 20 does not change and the acceleration cannot be detected. Therefore, the movable body 20 is designed so that when the acceleration in the vertical direction is applied, the rotational moment of the first seesaw piece 20a and the rotational moment of the second seesaw piece 20b are not balanced, and a predetermined inclination occurs in the movable body 20.

In the physical quantity sensor 100, by disposing the support axis Q at a position deviated from the center (the center of gravity) of the movable body 20 (by making the distances from the support axis Q to the distal ends of the seesaw pieces 20a and 20b different), the seesaw pieces 20a and 20b have different masses. That is, the movable body 20 has different masses on one side (first seesaw piece 20a) and the other side (second seesaw piece 20a), with the support axis Q as a boundary. In the illustrated example, the distance from the support axis Q to the end surface 23 of the first seesaw piece 20a is greater than the distance from the support axis Q to the end surface 24 of the second seesaw piece 20b. Further, the thickness of the first seesaw piece 20a is equal to the thickness of the second seesaw piece 20b. Therefore, the mass of the first seesaw piece 20a is larger than the mass of the second seesaw piece 20b.

In this way, since the seesaw pieces 20a and 20b have different masses, the rotational moment of the first seesaw piece 20a and the rotational moment of the second seesaw piece 20b can be made not balanced when the acceleration in the vertical direction is applied. Therefore, when the acceleration in the vertical direction is applied, a predetermined inclination can occur in the movable body 20.

Although not shown, the support axis Q is disposed at the center of the movable body 20 and the seesaw pieces 20a and 20b are made different in thickness, so that the seesaw pieces 20a and 20b may have different masses. Even in such a case, when the acceleration in the vertical direction is applied, a predetermined inclination can occur in the movable body 20.

The movable body 20 is provided apart from the substrate 10. The movable body 20 is provided above the recessed portion 11. A gap is provided between the movable body 20 and the substrate 10. The movable body 20 is provided apart from the support portion 40 by the connecting portions 30 and 32. Thus, the movable body 20 can swing like a seesaw.

The movable body 20 includes a first movable electrode 21 and a second movable electrode 22 provided, with a support axis Q as a boundary. The first movable electrode 21 is provided in the first seesaw piece 20a. The second movable electrode 22 is provided in the second seesaw piece 20b.

The first movable electrode 21 is a section overlapping the first fixed electrode 50 of the movable body 20, in plan view. The first movable electrode 21 and the first fixed electrode 50 form a capacitance C1. That is, the capacitance C1 is formed by the first movable electrode 21 and the first fixed electrode 50.

The second movable electrode 22 is a section overlapping the second fixed electrode 52 of the movable body 20, in plan view. The second movable electrode 22 and the second fixed electrode 52 form a capacitance C2. That is, the capacitance C2 is formed by the second movable electrode 22 and the second fixed electrode 52. In the physical quantity sensor 100, the movable body 20 is made of a conductive material (impurity-doped silicon), so that the movable electrodes 21 and 22 are provided. That is, the first seesaw piece 20a functions as the first movable electrode 21, and the second seesaw piece 20b functions as the second movable electrode 22.

The capacitance C1 and the capacitance C2 are configured so as to be equal to each other, for example, when the movable body 20 illustrated in FIG. 2 is in a horizontal state. The positions of the movable electrodes 21 and 22 change depending on the movement of the movable body 20. The electrostatic capacitances C1 and C2 change depending on the positions of the movable electrodes 21 and 22. A predetermined potential is applied to the movable body 20 through the connecting portions 30 and 32 and the support portion 40.

In the movable body 20, a through hole 25 penetrating the movable body 20 is formed. Thus, it is possible to reduce the influence of air (resistance of air) when the movable body 20 swings. A plurality of the through holes 25 are formed. In the illustrated example, the planar shape of the through hole 25 is a square.

In the movable body 20, an opening portion 26 penetrating the movable body 20 is formed. The opening portion 26 is provided on the support axis Q in plan view. The opening portion 26 is provided with connecting portions 30 and 32 and a support portion 40. In the illustrated example, the planar shape of the opening portion 26 is rectangular. The movable body 20 is connected to the support portion 40 through the connecting portions 30 and 32.

The first connecting portion 30 and the second connecting portion 32 connect the movable body 20 and the support portion 40. The connecting portions 30 and 32 function as torsion springs. Thus, the connecting portions 30 and 32 can have a strong restoring force against the torsional deformation of the connecting portions 30 and 32 as the movable body 20 swings like the seesaw.

The first connecting portion 30 and the second connecting portion 32 are disposed on the support axis Q in plan view. The connecting portions 30 and 32 extend along the support axis Q. The first connecting portion 30 extends from the support portion 40 in the +Y-axis direction. The second connecting portion 32 extends from the support portion 40 to the −Y-axis direction.

The support portion 40 is disposed in the opening portion 26. The support portion 40 is provided on the support axis Q in plan view. A portion of the support portion 40 is bonded to (connected to) the top surface 14 of the post portion 13. The support portion 40 supports the movable body 20 through the connecting portions 30 and 32.

The support portion 40 includes a first extending portion 41, a second extending portion 42, a third extending portion 43, a fourth extending portion 44, and a fifth extending portion 45. The first extending portion 41 extends in the X-axis direction. The first extending portion 41 is connected to the connecting portions 30 and 32. The second extending portion 42 and the third extending portion 43 extend from one end portion (specifically, the end portion in the −X-axis direction) of the first extending portion 41 in opposite directions along the Y axis. The fourth extending portion 44 and the fifth extending portion 45 extend from the other end portion (specifically, the end portion in the +X-axis direction) of the first extending portion 41 in opposite directions along the Y axis. The first extending portion 41 is spaced apart from the substrate 10. A part of each of the extending portions 42, 43, 44, and 45 is bonded to the post portion 13.

The support portion 40 has an H-shaped (substantially H-shaped) planar shape by having the extending portions 41, 42, 43, 44, and 45 as described above. The first extending portion 41 constitutes an H-shaped horizontal bar. The extending portions 42, 43, 44, and 45 constitute an H-shaped vertical bar.

The movable body 20, the connecting portions 30 and 32, and the support portion 40 are integrally provided. In the illustrated example, the movable body 20, the connecting portions 30 and 32, and the support portion 40 constitute one structure 2. The material of the movable body 20, the connecting portions 30 and 32, and the support portion 40 is, for example, silicon to which conductivity is imparted by doping impurities such as phosphorus and boron. In a case where the material of the substrate 10 is glass and the materials of the movable body 20, the connecting portions 30 and 32, and the support portion 40 are silicon, the substrate 10 and the support portion 40 are bonded to each other by, for example, anodic bonding.

In the physical quantity sensor 100, the structure 2 is fixed to the substrate 10 by one support portion 40. That is, the structure 2 is fixed to the substrate 10 at one point (one support portion 40). Therefore, in the physical quantity sensor 100, for example, compared with the case where the structure 2 is fixed to the substrate 10 at two points (two support portions), it is possible to reduce the influence of the stress caused by the difference between the coefficient of thermal expansion of the substrate 10 and the coefficient of thermal expansion of the structure 2 and the stress applied to the device at the time of mounting on the connecting portions 30 and 32.

The first fixed electrode 50 and the second fixed electrode 52 are fixed to the substrate 10. The fixed electrodes 50 and 52 are provided on the substrate 10. In the illustrated example, the fixed electrodes 50 and 52 are provided on the bottom surface 12 of the recessed portion 11.

The first fixed electrode 50 is provided on one side (in the illustrated example, −X-axis direction side) of the direction intersecting the extending direction of the support axis Q in plan view. The first fixed electrode 50 overlaps the first seesaw piece 20a in plan view. The first fixed electrode 50 is disposed to face the first movable electrode 21.

The second fixed electrode 52 is provided on the other side (in the illustrated example, +X-axis direction side) of the direction intersecting the extending direction of the support axis Q in plan view. The second fixed electrode 52 overlaps the second seesaw piece 20b in plan view. The second fixed electrode 52 is disposed to face the second movable electrode 22. In plan view, the area of the section overlapping the movable body 20 of the first fixed electrode 50 and the area of the section overlapping the movable body 20 of the second fixed electrode 52 are equal, for example.

The first dummy electrode 60, the second dummy electrode 62, and the third dummy electrode 64 are fixed to the substrate 10. The dummy electrodes 60, 62, and 64 are provided on the substrate 10. In the illustrated example, the dummy electrodes 60, 62, and 64 are provided on the bottom surface 12 of the recessed portion 11. The dummy electrodes 60, 62, and 64 are electrically connected to the movable body 20. The dummy electrodes 60, 62, and 64 have the same potential as the movable body 20, for example.

The first dummy electrode 60 is provided on one side (in the illustrated example, −X-axis direction side) of the direction intersecting the extending direction of the support axis Q in plan view. In the illustrated example, the first dummy electrode 60 is provided on the −X-axis direction side of the first fixed electrode 50. The first dummy electrode 60 overlaps the movable body 20 in plan view.

The first dummy electrode 60 is provided adjacent to the first fixed electrode 50. That is, there is no other electrodes 52, 62, and 64 between the first dummy electrode 60 and the first fixed electrode 50. In the illustrated example, the first dummy electrode 60 is electrically connected to the movable body 20 through the third wiring 74, the third dummy electrode 64, the fourth wiring 76, the support portion 40, and the connecting portions 30 and 32.

The first dummy electrode 60 and the first fixed electrode 50 form a capacitance C3. That is, the capacitance C3 is formed by the first fixed electrode 50 and the first dummy electrode 60.

The second dummy electrode 62 is provided on the other side (in the illustrated example, +X-axis direction side) of the direction intersecting the extending direction of the support axis Q in plan view. In the illustrated example, the second dummy electrode 62 is provided on the +X-axis direction side of the second fixed electrode 52. The second dummy electrode 62 does not overlap the movable body 20 in plan view. That is, the second dummy electrode 62 is provided outside the outer edge of the movable body 20 in plan view. In the illustrated example, the second dummy electrode 62 is electrically connected to the movable body 20 through the third wiring 74, the third dummy electrode 64, the fourth wiring 76, the support portion 40, and the connecting portions 30 and 32.

The second dummy electrode 62 and the second fixed electrode 52 form a capacitance C4. That is, the capacitance C4 is formed by the second fixed electrode 52 and the second dummy electrode 62.

The third dummy electrode 64 is provided between the first fixed electrode 50 and the second fixed electrode 52. The third dummy electrode 64 overlaps the movable body 20 in plan view. In the illustrated example, two third dummy electrodes 64 are provided. In plan view, one third dummy electrode 64 is provided on the +Y-axis direction side of the support portion 40 and the other third dummy electrode 64 is provided on the −Y-axis direction side of the support portion 40. The two third dummy electrodes 64 are connected by the fourth wiring 76. In the illustrated example, the third dummy electrode 64 is electrically connected to the movable body 20 through the fourth wiring 76, the support portion 40, and the connecting portions 30 and 32.

The third dummy electrode 64 and the first fixed electrode 50 form a capacitance C6 (not illustrated). That is, the capacitance C6 is formed by the first fixed electrode 50 and the third dummy electrode 64. Further, the third dummy electrode 64 and the second fixed electrode 52 form a capacitance C7 (not illustrated). That is, the capacitance C7 is formed by the second fixed electrode 52 and the third dummy electrode 64.

The fixed electrodes 50 and 52 and the dummy electrodes 60, 62, and 64 include a first electrode material layer 4 and a second electrode material layer 6, as illustrated in FIGS. 1 and 2.

The first electrode material layer 4 is provided on the substrate 10. The first electrode material layer 4 has, for example, a rectangular shape in plan view.

The first electrode material layer 4 is made of a material which is difficult to process by direct etching. Specifically, the material of the first electrode material layer 4 is platinum (Pt), ruthenium (Ru), osmium (Os), rhodium (Rh), iridium (Ir), or the like.

The second electrode material layer 6 is provided on the substrate 10 and on the first electrode material layer 4. In plan view, the second electrode material layer 6 overlaps the end surface on the +X-axis direction side of the first electrode material layer 4 constituting the first dummy electrode 60, the end surface on the −X-axis direction side and the end surface on the +X-axis direction side of the first electrode material layer 4 constituting the first fixed electrode 50, the end surface on the −X-axis direction side and the end surface on the +X-axis direction side of the first electrode material layer 4 constituting the third dummy electrode 64, the end surface on the −X-axis direction side and the end surface on the +X-axis direction side of the first electrode material layer 4 constituting the second fixed electrode 52, and the end surface on the −X-axis direction side of the first electrode material layer 4 constituting the second dummy electrode 62. The second electrode material layer 6 has, for example, a rectangular shape in plan view.

The second electrode material layer 6 is made of a material that can be processed by direct etching. Specifically, the material of the second electrode material layer 6 is titanium tungsten (TiW), aluminum (Al), copper (Cu), silver (Ag), gold (Au), indium tin oxide (ITO), or the like.

The second electrode material layer 6 constituting the first fixed electrode 50 and the second electrode material layer 6 constituting the first dummy electrode 60 are provided between the first electrode material layer 4 constituting the first fixed electrode 50 and the first electrode material layer 4 constituting the first dummy electrode 60. A distance D2 between the second electrode material layer 6 constituting the first fixed electrode 50 and the second electrode material layer 6 constituting the first dummy electrode 60 is smaller than a distance D1 between the first electrode material layer 4 constituting the first fixed electrode 50 and the first electrode material layer 4 constituting the first dummy electrode 60. The distance D1 is, for example, 8 μm or more and 30 μm or less. The distance D2 is, for example, 3 μm or more and 10 μm or less.

In this way, in the electrodes adjacent to each other in the X-axis direction, the second electrode material layer 6 constituting one electrode and the second electrode material layer 6 constituting the other electrode are provided between the first electrode material layer 4 constituting one electrode and the first electrode material layer 4 constituting the other electrode. Further, a distance between the second electrode material layer 6 constituting one electrode and the second electrode material layer 6 constituting the other electrode is smaller than a distance between the first electrode material layer 4 constituting one electrode and the first electrode material layer 4 constituting the other electrode.

The first wiring 70 is provided on the substrate 10. The first wiring 70 connects the first pad 80 with the first fixed electrode 50. In the illustrated example, the first wiring 70 extends from the first pad 80 through the first groove portion 17 and the recessed portion 11 to the first fixed electrode 50.

The second wiring 72 is provided on the substrate 10. The second wiring 72 connects the second pad 82 with the second fixed electrode 52. In the illustrated example, the second wiring 72 extends from the second pad 82 through the second groove portion 18 and the recessed portion 11 to the second fixed electrode 52.

The third wiring 74 is provided on the substrate 10. The third wiring 74 connects the third pad 84 with the dummy electrodes 60, 62, and 64. In the illustrated example, the third wiring 74 extends from the third pad 84 through the third groove portion 19, branches into three, and then extends through the recessed portion 11, respectively, to the dummy electrodes 60, 62, and 64. The materials of the wirings 70, 72, and 74 are the same as those of the first electrode material layer 4 or the second electrode material layer 6, for example.

The fourth wiring 76 is provided on the substrate 10. The fourth wiring 76 includes a wiring layer portion 76a and a bump portion 76b.

The wiring layer portion 76a of the fourth wiring 76 connects two third dummy electrodes 64 to each other. Further, the wiring layer portion 76a extends from the third dummy electrode 64 through the hollow 15 to the bump portion 76b. The part provided in the hollow 15 of the wiring layer portion 76a overlaps the support portion 40 in plan view. In the illustrated example, the planar shape of the part provided in the hollow 15 of the wiring layer portion 76a is H-shaped (substantially H-shaped). The material of the wiring layer portion 76a is the same as those of the first electrode material layer 4 or the second electrode material layer 6, for example.

The bump portion 76b of the fourth wiring 76 is provided on the wiring layer portion 76a. The bump portion 76b connects the wiring layer portion 76a with the support portion 40. In the illustrated example, four bump portions 76b are provided. The bump portion 76b is connected to the extending portions 42, 43, 44, and 45. The material of the bump portion 76b is, for example, aluminum, gold, and platinum.

The lid body 90 is provided on the substrate 10. The lid body 90 is bonded to the substrate 10. The lid body 90 and the substrate 10 form a cavity 92 for accommodating the movable body 20. The cavity 92 is, for example, an inert gas (for example, nitrogen gas) atmosphere. The material of the lid body 90 is, for example, silicon. In a case where the material of the lid body 90 is silicon and the material of the substrate 10 is glass, the substrate 10 and the lid body 90 are bonded to each other by, for example, anodic bonding.

Next, the operation of the physical quantity sensor 100 will be described.

In the physical quantity sensor 100, the movable body 20 swings around the support axis Q according to physical quantities such as an acceleration and an angular velocity. With the movement of the movable body 20, the distance between the first movable electrode 21 and the first fixed electrode 50, and the distance between the second movable electrode 22 and the second fixed electrode 52 change. Specifically, for example, when an acceleration in the vertically upward direction (+Z-axis direction) is applied to the physical quantity sensor 100, the movable body 20 rotates counterclockwise, the distance between the first movable electrode 21 and the first fixed electrode 50 decreases, and the distance between the second movable electrode 22 and the second fixed electrode 52 increases. As a result, the capacitance C1 increases and the capacitance C2 decreases. Further, for example, when an acceleration in the vertical downward direction (−Z-axis direction) is applied to the physical quantity sensor 100, the movable body 20 rotates clockwise, the distance between the first movable electrode 21 and the first fixed electrode 50 increases, the distance between the second movable electrode 22 and the second fixed electrode 52 decreases. As a result, the capacitance C1 decreases and the capacitance C2 increases.

The physical quantity sensor 100 measures the sum (first capacitance) of the capacitance C1, the capacitance C3, and the capacitance C5, by using the pads 80 and 84. Further, the physical quantity sensor 100 measures the sum (second capacitance) of the capacitance C2, the capacitance C3, the capacitance C4, and the capacitance C6, by using the pads 82 and 84. Then, based on the difference between the first capacitance and the second capacitance (by a so-called differential detection method), it is possible to detect physical quantities such as the direction and magnitude of an acceleration, an angular velocity and the like.

As described above, the physical quantity sensor 100 can be used as an inertial sensor such as an acceleration sensor or a gyro sensor, and specifically, for example, can be used as a capacitive acceleration sensor that measures the acceleration in the vertical direction (Z-axis direction).

The physical quantity sensor 100 has, for example, the following features.

In the physical quantity sensor 100, the second electrode material layer 6 constituting the first fixed electrode 50 and the second electrode material layer 6 constituting the first dummy electrode 60 are provided between the first electrode material layer 4 constituting the first fixed electrode 50 and the first electrode material layer 4 constituting the first dummy electrode 60, and the distance D2 between the second electrode material layer 6 constituting the first fixed electrode 50 and the second electrode material layer 6 constituting the first dummy electrode 60 is smaller than the distance D1 between the first electrode material layer 4 constituting the first fixed electrode 50 and the first electrode material layer 4 constituting the first dummy electrode 60. Therefore, in the physical quantity sensor 100, it is possible to reduce the distance (that is, the distance D2) between the first fixed electrode 50 and the first dummy electrode 60.

Here, since the first electrode material layer 4 is made of a material which is difficult to process by direct etching, the first electrode material layer 4 is processed (patterned) by the lift-off method. Therefore, in the case where the first fixed electrode 50 and the first dummy electrode 60 are configured with only the first electrode material layer 4, it is difficult to perform microfabrication and to reduce the distance between the first fixed electrode 50 and the first dummy electrode 60.

On the other hand, the second electrode material layer 6 is made of a material that can be processed by direct etching. Therefore, the second electrode material layer 6 can be directly processed by microfabrication, and the distance between the first fixed electrode 50 and the first dummy electrode 60 can be reduced.

Therefore, in the physical quantity sensor 100, since the distance between the first fixed electrode 50 and the first dummy electrode 60 can be reduced, the capacitance C3 formed by the first fixed electrode 50 and the first dummy electrode 60 is adjusted with high accuracy so that the capacitance offset (the difference between the first capacitance and the second capacitance) is reduced. Therefore, in the physical quantity sensor 100, the capacitance offset can be reduced. For example, in the physical quantity sensor 100, the capacitance offset can be reduced to such an extent that it can be adjusted by an integrated circuit (IC) electrically connected to the physical quantity sensor 100, and the yield can be improved.

Similarly, in the physical quantity sensor 100, the distance between the first fixed electrode 50 and the third dummy electrode 64, the distance between the second fixed electrode 52 and the second dummy electrode 62, and the distance between the second fixed electrode 52 and the third dummy electrode 64 can be reduced.

Further, since the physical quantity sensor 100 includes the first dummy electrode 60, it is possible to suppress sticking of the movable body 20 to the substrate 10. Specifically, in the case where the material of the substrate 10 is glass and the materials of the movable body 20 and the lid body 90 are silicon, even if the substrate 10 and the lid body 90 are anodically bonded, it is possible to suppress sticking of the movable body 20 to the substrate 10 by the electrostatic force generated between the substrate 10 and the movable body 20.

Further, in the physical quantity sensor 100, since the distance between the first fixed electrode 50 and the first dummy electrode 60 can be reduced, the exposed area of the bottom surface 12 of the substrate 10 can be reduced. Therefore, in the physical quantity sensor 100, it is possible to suppress sticking more reliably.

In the physical quantity sensor 100, the material of the first electrode material layer 4 is platinum. Platinum is poor in reactivity (it hardly reacts with other elements). Therefore, the physical quantity sensor 100 can have high reliability.

In the physical quantity sensor 100, the material of the second electrode material layer 6 is titanium tungsten. Therefore, in the physical quantity sensor 100, it is possible to process the conductive layer (a second conductive layer 6a to be described later) to be the second electrode material layer 6 by direct etching.

The physical quantity sensor 100 includes a third dummy electrode 64 that overlaps the movable body 20 in plan view and is electrically connected to the movable body 20. Therefore, in the physical quantity sensor 100, it is possible to suppress sticking more reliably.

The physical quantity sensor 100 includes the second dummy electrode 62 provided on the +X-axis direction side of the second fixed electrode 52. Therefore, in the physical quantity sensor 100, the capacitance C4 can be formed by the second fixed electrode 52 and the second dummy electrode 62. Thus, in the physical quantity sensor 100, dummy electrodes (that is, dummy electrodes 62, 64) can be provided on both sides of the second fixed electrode 52 in the X-axis direction, so that the capacitance offset can be reduced.

In the above description, an example has been described in which the dummy electrodes 60, 62, and 64 are electrically connected to the movable body 20, but the dummy electrodes 60, 62, and 64 may not be electrically connected to the movable body 20 if the dummy electrodes 60, 62, and 64 can have the same potential as the movable body 20. The same potential includes, for example, a case where unavoidable fluctuation of voltage is obtained (for example, fluctuation of about ±5%), in addition to a case where the voltage is the same.

In the above description, an example has been described in which the fixed electrodes 50 and 52 and the dummy electrodes 60, 62, and 64 all have the electrode material layers 4 and 6, but one pair of the adjacent electrodes in the X-axis direction may have the electrode material layers 4 and 6. Alternatively, any two or three pairs of adjacent electrodes in the X-axis direction may have electrode material layers 4 and 6.

In the above description, the case where the physical quantity sensor 100 is an acceleration sensor has been described, but the physical quantity sensor according to the invention may be a gyro sensor.

1.2. Physical Quantity Sensor Manufacturing Method

Figure 5:
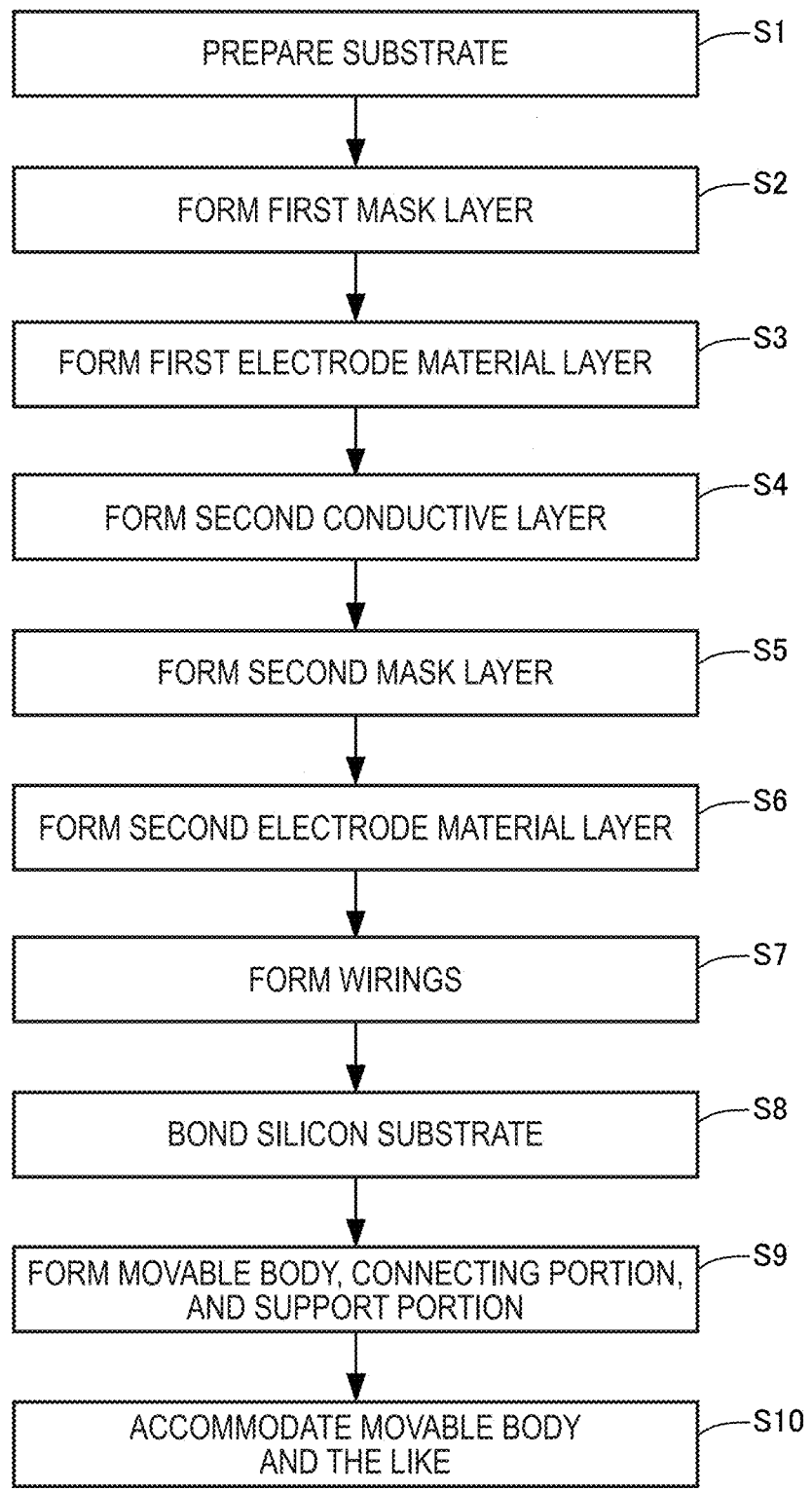
FIG. 5 is a flowchart for explaining a physical quantity sensor manufacturing method according to the first embodiment.

Next, a manufacturing method of the physical quantity sensor 100 according to the first embodiment will be described with reference to the drawings. FIG. 5 is a flowchart for explaining the manufacturing method of the physical quantity sensor 100 according to the first embodiment. FIG. 6 to FIG. 17 are cross-sectional views schematically illustrating the manufacturing process of the physical quantity sensor 100 according to the first embodiment. Note that FIG. 6 and FIG. 15 to FIG. 17 show the same cross section as FIG. 2. Further, FIG. 7 to FIG. 14 show a cross section taken along the line A-A illustrated in FIG. 1.

Figure 6:
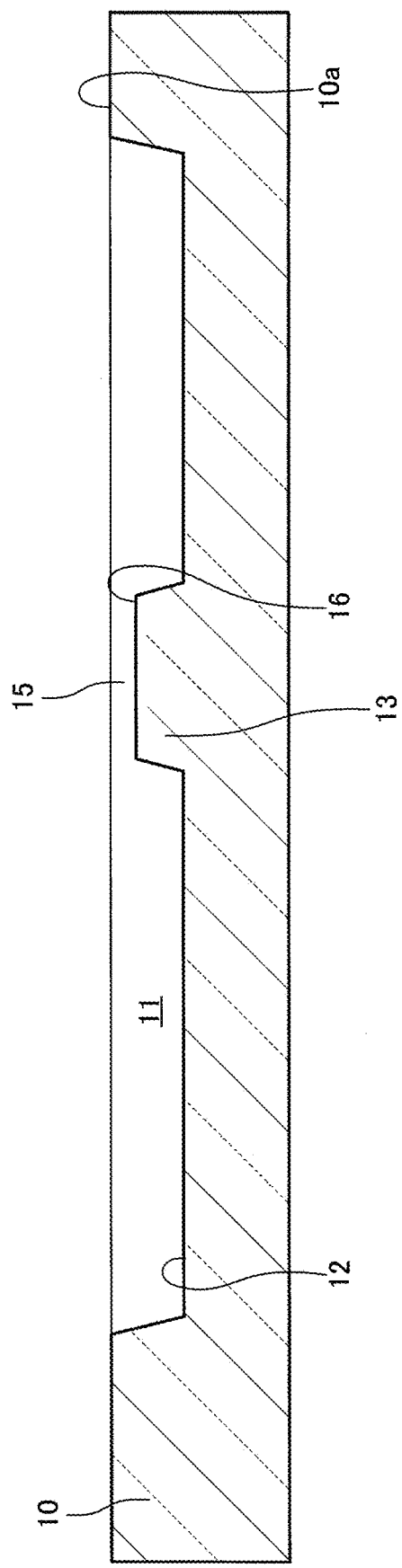
FIG. 6 is a cross-sectional view schematically illustrating the manufacturing process of the physical quantity sensor according to the first embodiment.

First, as illustrated in FIG. 6, a substrate 10 provided with a recessed portion 11, a post portion 13 having a hollow 15, and groove portions 17, 18, and 19 (see FIG. 1) is prepared, by patterning, for example, a glass substrate (step S1). The patterning is performed by, for example, photolithography and etching.

Figure 7:
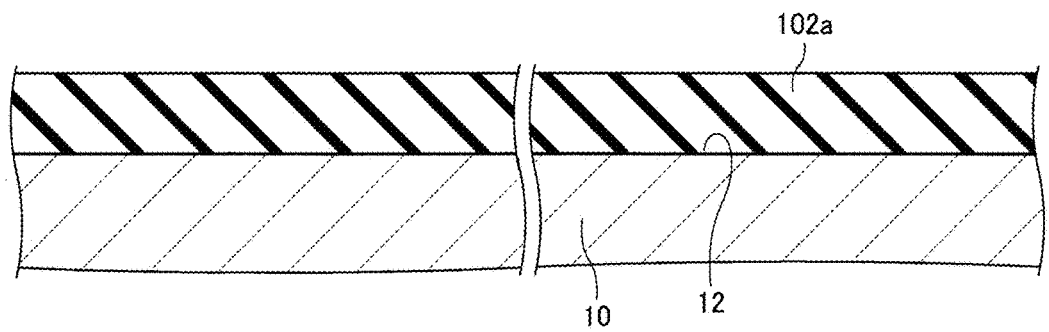
FIG. 7 is a cross-sectional view schematically illustrating the manufacturing process of the physical quantity sensor according to the first embodiment.
Figure 8:
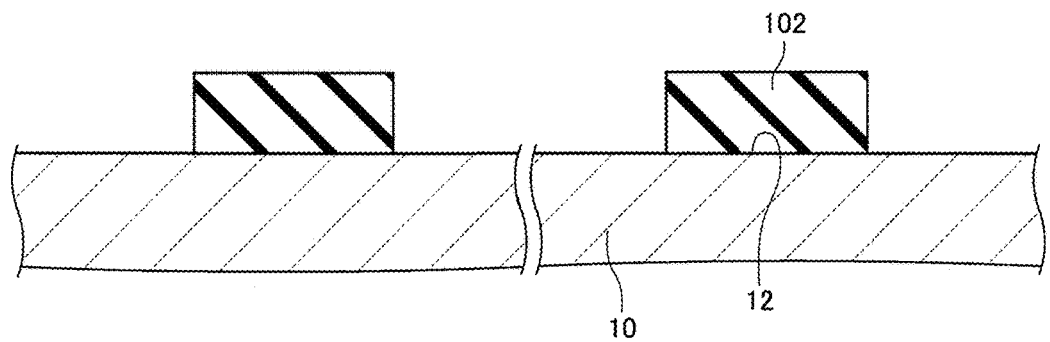
FIG. 8 is a cross-sectional view schematically illustrating the manufacturing process of the physical quantity sensor according to the first embodiment.

Next, a first mask layer 102 is formed on the substrate 10 (step S2). Specifically, first, as illustrated in FIG. 7, a first mask material layer 102a is formed on the substrate 10 by, for example, a spin coat method. The first mask material layer 102a is, for example, a resist layer. Next, as illustrated in FIG. 8, the first mask material layer 102a is patterned by, for example, exposure and development. Through the above process, the first mask layer 102 having a predetermined shape can be formed.

Figure 9:
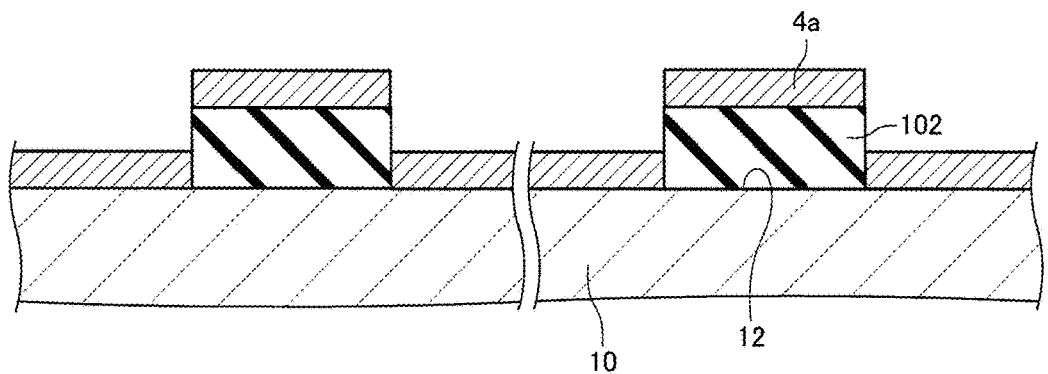
FIG. 9 is a cross-sectional view schematically illustrating the manufacturing process of the physical quantity sensor according to the first embodiment.
Figure 10:
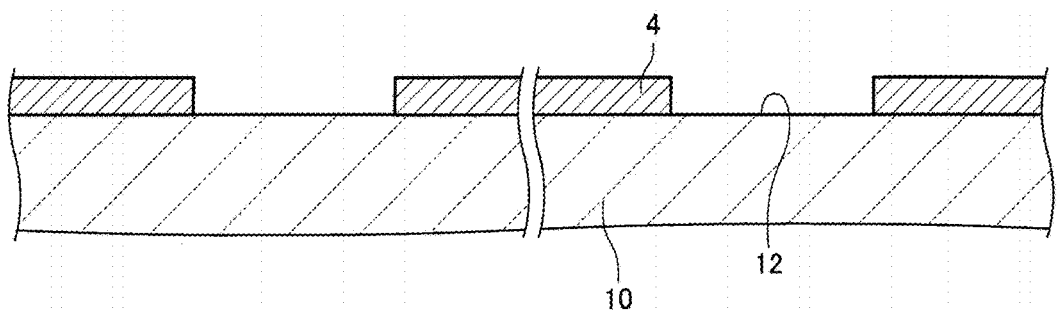
FIG. 10 is a cross-sectional view schematically illustrating the manufacturing process of the physical quantity sensor according to the first embodiment.

Next, a first electrode material layer 4 is formed on the substrate 10 and on the first mask layer 102 (step S3). Specifically, first, as illustrated in FIG. 9, a first conductive layer 4a is formed on the substrate 10 and on the first mask layer 102. The first conductive layer 4a is formed by, for example, sputtering, chemical vapor deposition (CVD) method or the like. Next, as illustrated in FIG. 10, the first mask layer 102 is immersed in a stripping solution, and the first mask layer 102 and the first conductive layer 4a provided on the first mask layer 102 are removed. Through the above process, the first electrode material layer 4 can be formed.

As described above, the first electrode material layer 4 is formed by the lift-off method. In the lift-off method, since there is the first mask layer 102 between the adjacent first electrode material layers 4 (see FIG. 9), it is difficult to make the distance between the adjacent first electrode material layers 4 sufficiently small (for example, smaller than 8 μm).

Figure 11:
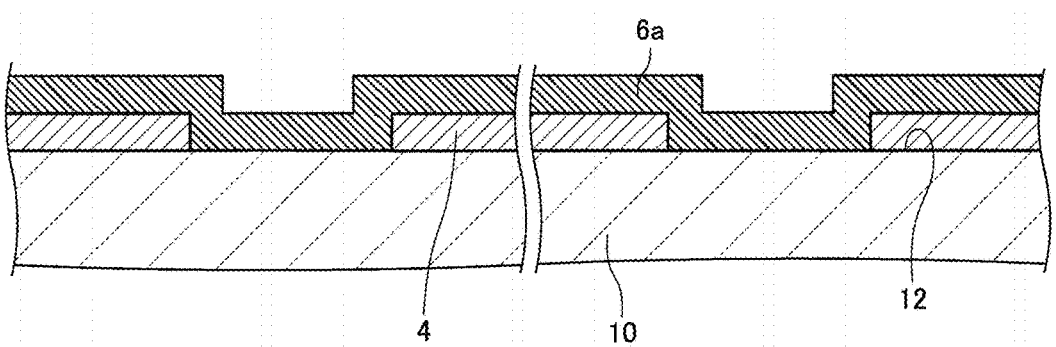
FIG. 11 is a cross-sectional view schematically illustrating the manufacturing process of the physical quantity sensor according to the first embodiment.

Next, as illustrated in FIG. 11, a second conductive layer 6a is formed on the substrate 10 and on the first electrode material layer 4 (step S4). The second conductive layer 6a is formed in the same method as the first conductive layer 4a, for example.

Figure 12:
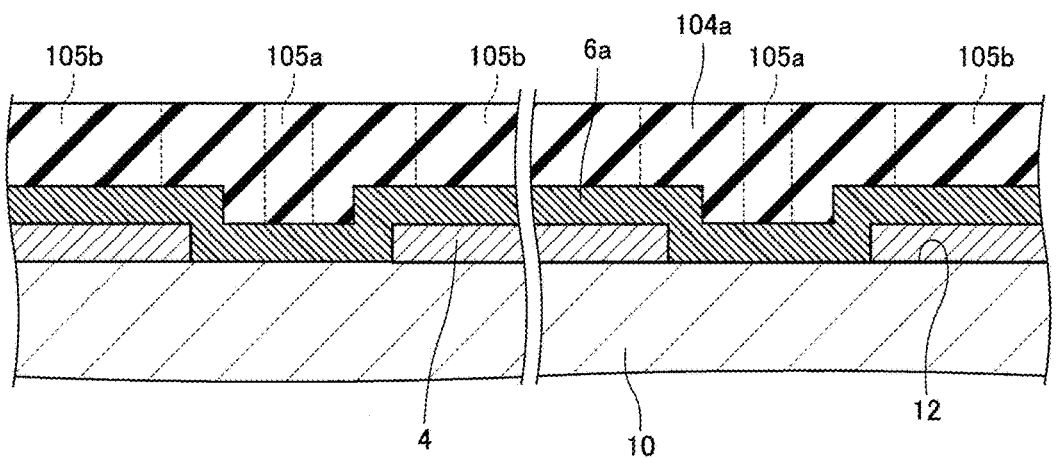
FIG. 12 is a cross-sectional view schematically illustrating the manufacturing process of the physical quantity sensor according to the first embodiment.
Figure 13:
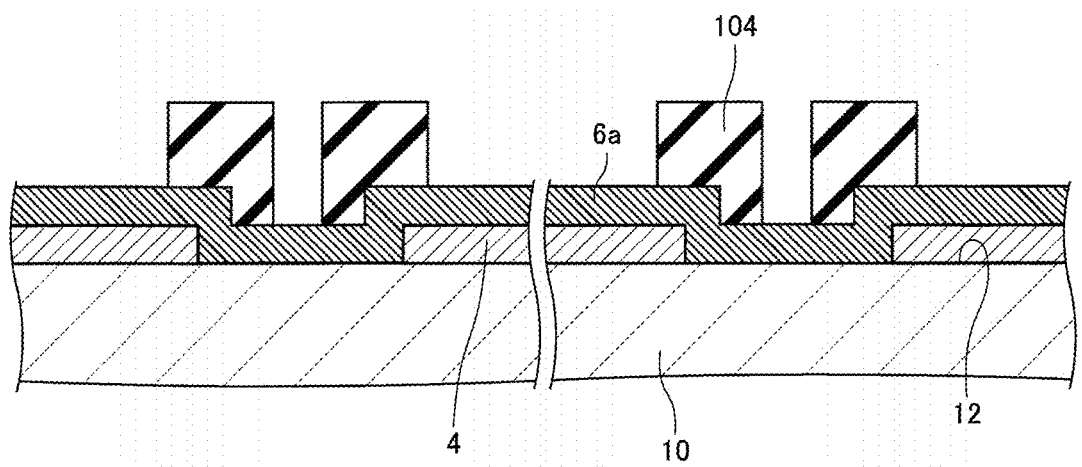
FIG. 13 is a cross-sectional view schematically illustrating the manufacturing process of the physical quantity sensor according to the first embodiment.

Next, a second mask layer 104 is formed on the second conductive layer 6a (step S5). Specifically, first, as illustrated in FIG. 12, a second mask material layer 104a is formed on the second conductive layer 6a by, for example, a spin coat method. The second mask material layer 104a is, for example, a resist layer. Next, as illustrated in FIG. 13, the second mask material layer 104a is patterned by, for example, exposure and development, and a part 105a (see FIG. 12) of a section of the second mask material layer 104a not overlapping the first electrode material layer 4 in plan view is removed. Through the above process, the second mask layer 104 having a predetermined shape can be formed.

In the example illustrated in FIG. 13, a part 105b (see FIG. 12) of a section of the second mask material layer 104a overlapping the first electrode material layer 4 in plan view is also removed.

Figure 14:
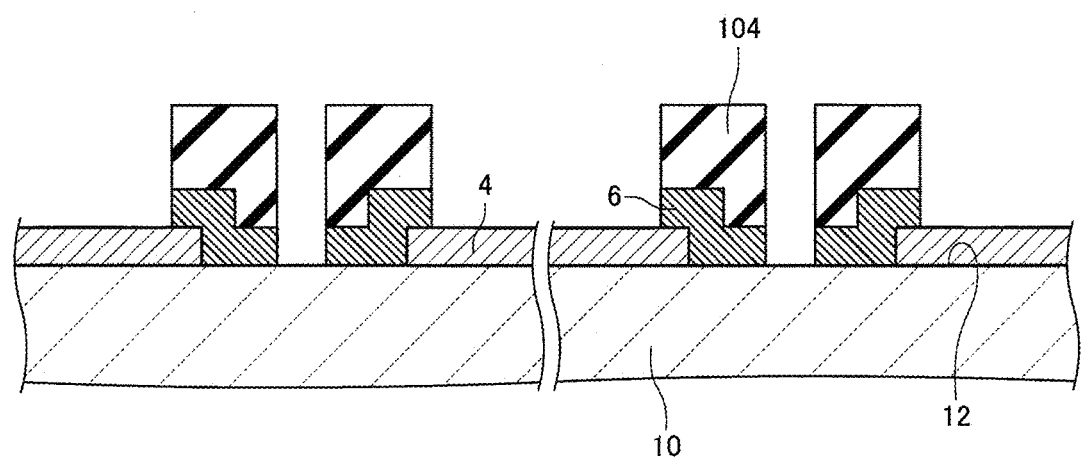
FIG. 14 is a cross-sectional view schematically illustrating the manufacturing process of the physical quantity sensor according to the first embodiment.

Next, a second electrode material layer 6 is formed on the substrate 10 and on the first electrode material layer 4 (step S6). Specifically, first, as illustrated in FIG. 14, the second conductive layer 6a is etched using the second mask layer 104 as a mask so that the second conductive layer 6a is provided on the first electrode material layer 4 and the substrate 10, thereby forming a second electrode material layer 6. The etching of the second conductive layer 6a is performed by, for example, wet etching. Next, the second mask layer 104 is immersed in a stripping solution and removed. Through the above process, the second electrode material layer 6 can be formed.

Figure 15:
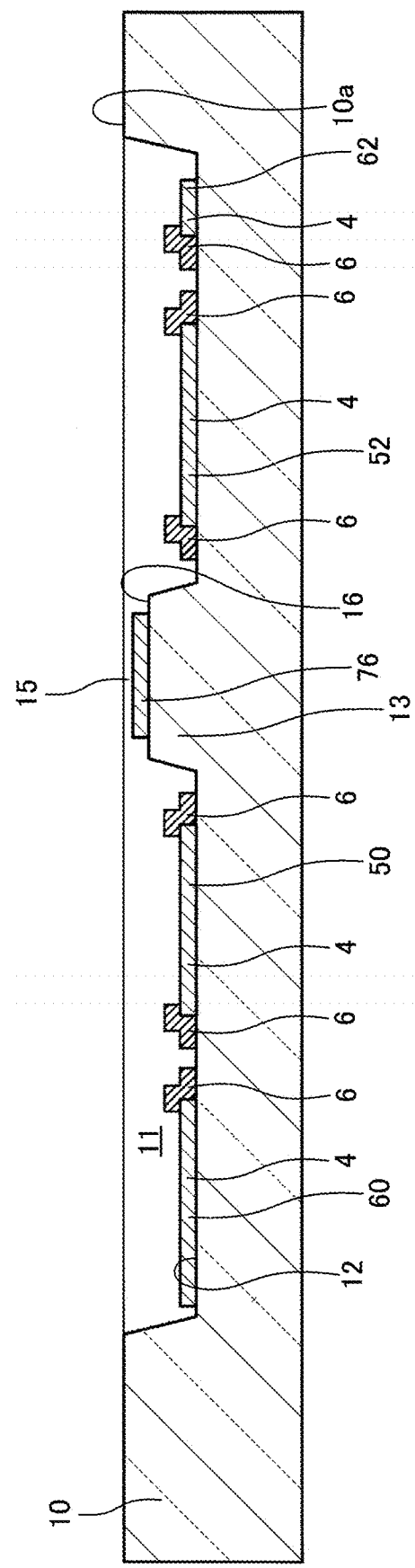
FIG. 15 is a cross-sectional view schematically illustrating the manufacturing process of the physical quantity sensor according to the first embodiment.

By the above step S2 to step S6, as illustrated in FIG. 15, fixed electrodes 50 and 52 and dummy electrodes 60, 62, and 64 can be formed on the substrate 10 (specifically, on the bottom surface 12 of the recessed portion 11) (electrode forming process). In the electrode forming, the first fixed electrode 50 and the first dummy electrode 60 are formed so as to be adjacent to each other.

Next, wirings 70, 72, and 74 and a wiring layer portion 76a are formed on the substrate 10 (see step S7, FIG. 1). Next, a bump portion 76b is formed on the wiring layer portion 76a (see FIG. 3 and FIG. 4). Thus, the fourth wiring 76 can be formed. The top surface of the bump portion 76b is formed so as to be positioned higher than the top surface 14 of the post portion 13. Next, pads 80, 82, and 84 are formed so as to be connected with wirings 70, 72, and 74, respectively (see FIG. 1). The wirings 70, 72, 74, and 76, and the pad 80, 82, and 84 are formed, for example, by film formation by sputtering or CVD and patterning. The patterning is performed by, for example, photolithography and etching. In addition, the wirings 70, 72, and 74 and the wiring layer portion 76a may be formed in the forming the first electrode material layer 4.

Figure 16:
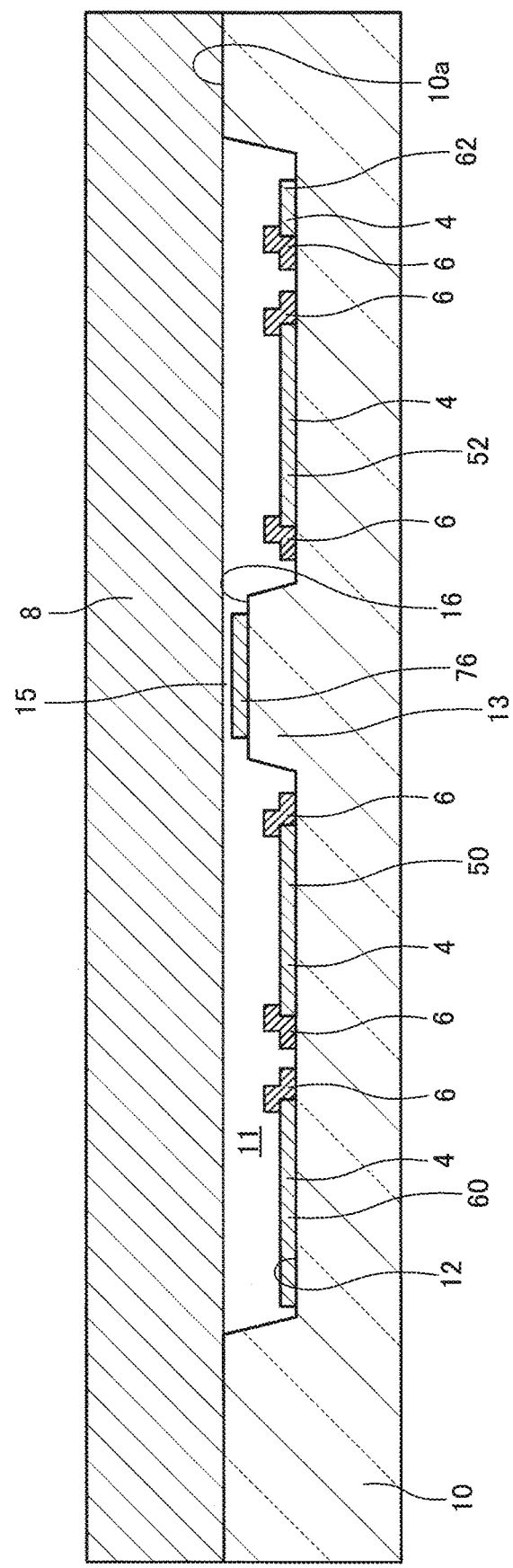
FIG. 16 is a cross-sectional view schematically illustrating the manufacturing process of the physical quantity sensor according to the first embodiment.

Next, as illustrated in FIG. 16, for example, a silicon substrate 8 is bonded to the substrate 10 (step S8). The bonding of the substrate 10 and the silicon substrate 8 is performed, for example, by anodic bonding. Thereby, the substrate 10 and the silicon substrate 8 can be firmly bonded. When bonding the silicon substrate 8 to the substrate 10, the silicon substrate 8 is depressed the bump portion 76b of the fourth wiring 76 (see FIG. 3 and FIG. 4). Thus, the silicon substrate 8 can be firmly connected to the bump portion 76b.

Figure 17:
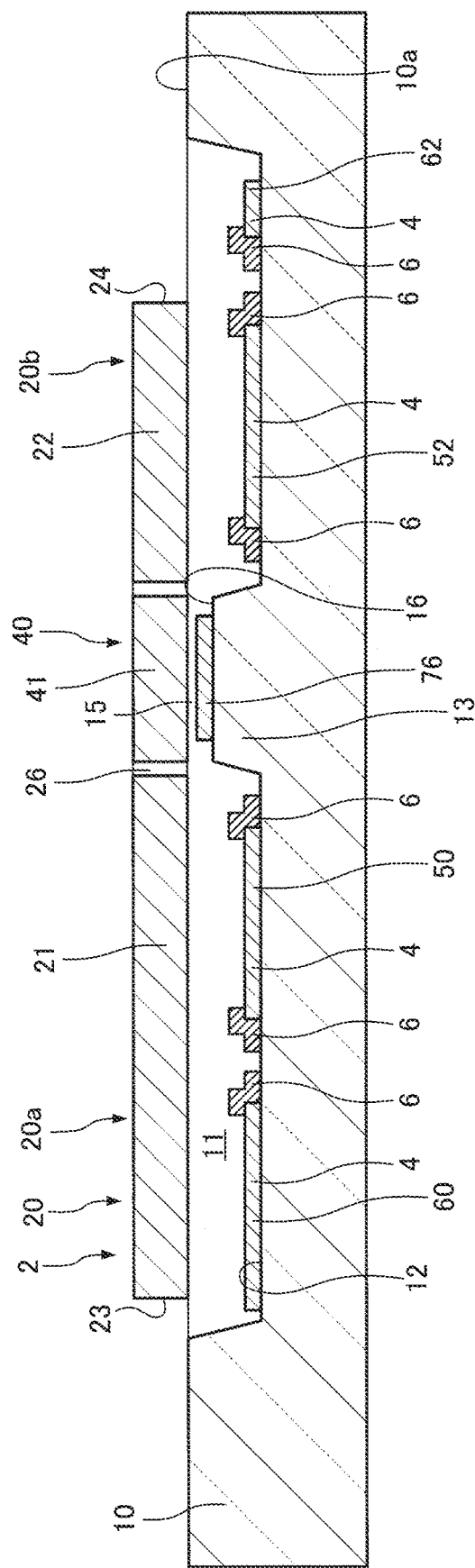
FIG. 17 is a cross-sectional view schematically illustrating the manufacturing process of the physical quantity sensor according to the first embodiment.

Next, as illustrated in FIG. 17, the silicon substrate 8 is ground by, for example, a grinding machine to form a thin film, then patterned into a predetermined shape, and the movable body 20, the connecting portions 30, 32, and the support portion 40 are integrally formed (step S9, movable body forming process). Patterning is performed by photolithography and etching (dry etching), and the Bosch method can be used as a more specific etching technique.

Next, as illustrated in FIG. 2, the lid body 90 is bonded to the substrate 10, and the movable body 20 and the like are accommodated in the cavity 92 formed by the substrate 10 and the lid body 90 (step S10). The bonding of the substrate 10 and the lid body 90 is performed, for example, by anodic bonding. Thereby, the substrate 10 and the lid body 90 can be firmly bonded. By performing this process in an inert gas atmosphere, it is possible to fill the cavity 92 with an inert gas.

Through the above process, the physical quantity sensor 100 can be manufactured.

The manufacturing method of the physical quantity sensor 100 includes forming the second conductive layer 6a on the substrate 10 and on the first electrode material layer 4, forming a second mask layer 104 by forming a second mask material layer 104a on the second conductive layer 6a, and removing a part 105a of a section of the second mask material layer 104a not overlapping the first electrode material layer 4 in plan view, and forming a second electrode material layer 6 by etching the second conductive layer 6a using the second mask layer 104 as a mask such that the second conductive layer 6a is provided on the first electrode material layer 4 and the substrate 10. Thus, in the manufacturing method of the physical quantity sensor 100, the second electrode material layer 6 constituting the first fixed electrode 50 and the second electrode material layer 6 constituting the first dummy electrode 60 can be provided between the first electrode material layer 4 constituting the first fixed electrode 50 and the first electrode material layer 4 constituting the dummy electrode 60. Further, in the manufacturing method of the physical quantity sensor 100, the distance D2 between the second electrode material layer 6 constituting the first fixed electrode 50 and the second electrode material layer 6 constituting the first dummy electrode 60 can be smaller than the distance D1 between the first electrode material layer 4 constituting the first fixed electrode 50 and the first electrode material layer 4 constituting the first dummy electrode 60. Therefore, in the manufacturing method of the physical quantity sensor 100, it is possible to reduce the distance between the first fixed electrode 50 and the first dummy electrode 60. Therefore, in the manufacturing method of the physical quantity sensor 100, the capacitance C3 formed by the first fixed electrode 50 and the first dummy electrode 60 can be adjusted with high accuracy, and the capacitance offset can be reduced.

1.3. Modification Example of Physical Quantity Sensor

1.3.1. First Modification Example

Figure 18:
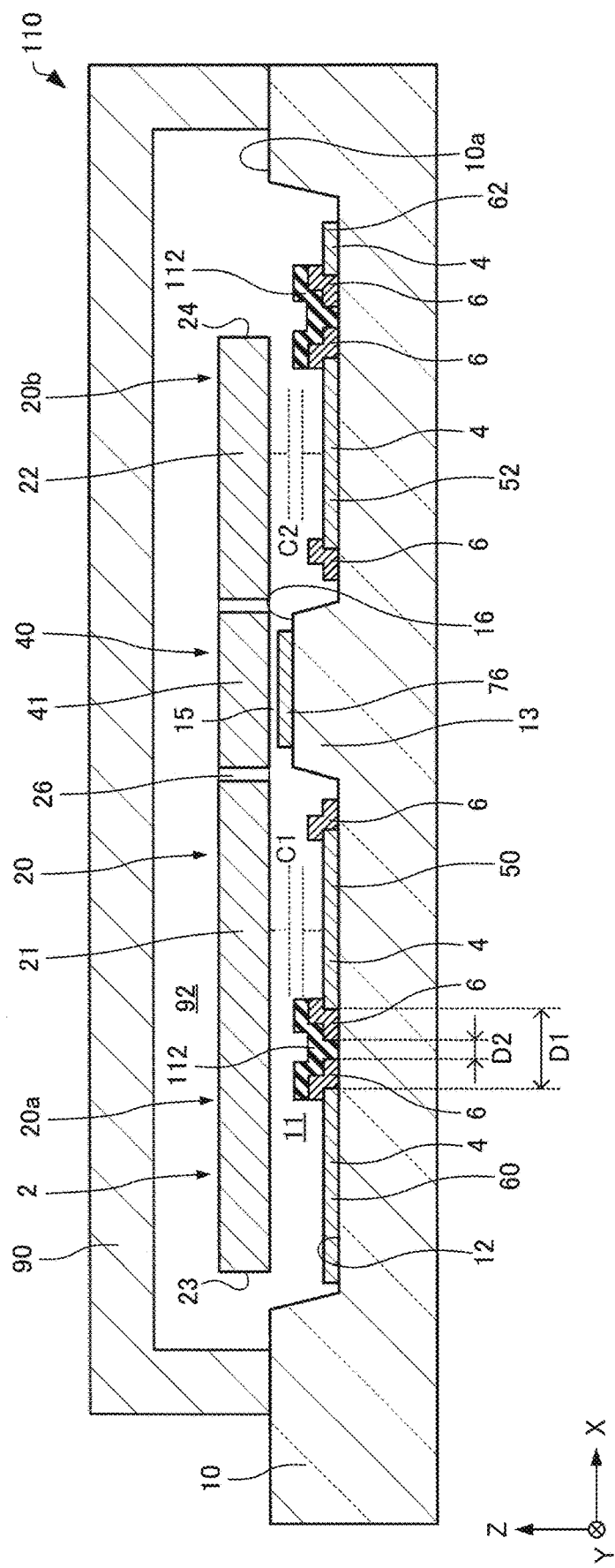
FIG. 18 is a cross-sectional view schematically illustrating a physical quantity sensor according to a first modification example of the first embodiment.
Figure 25:
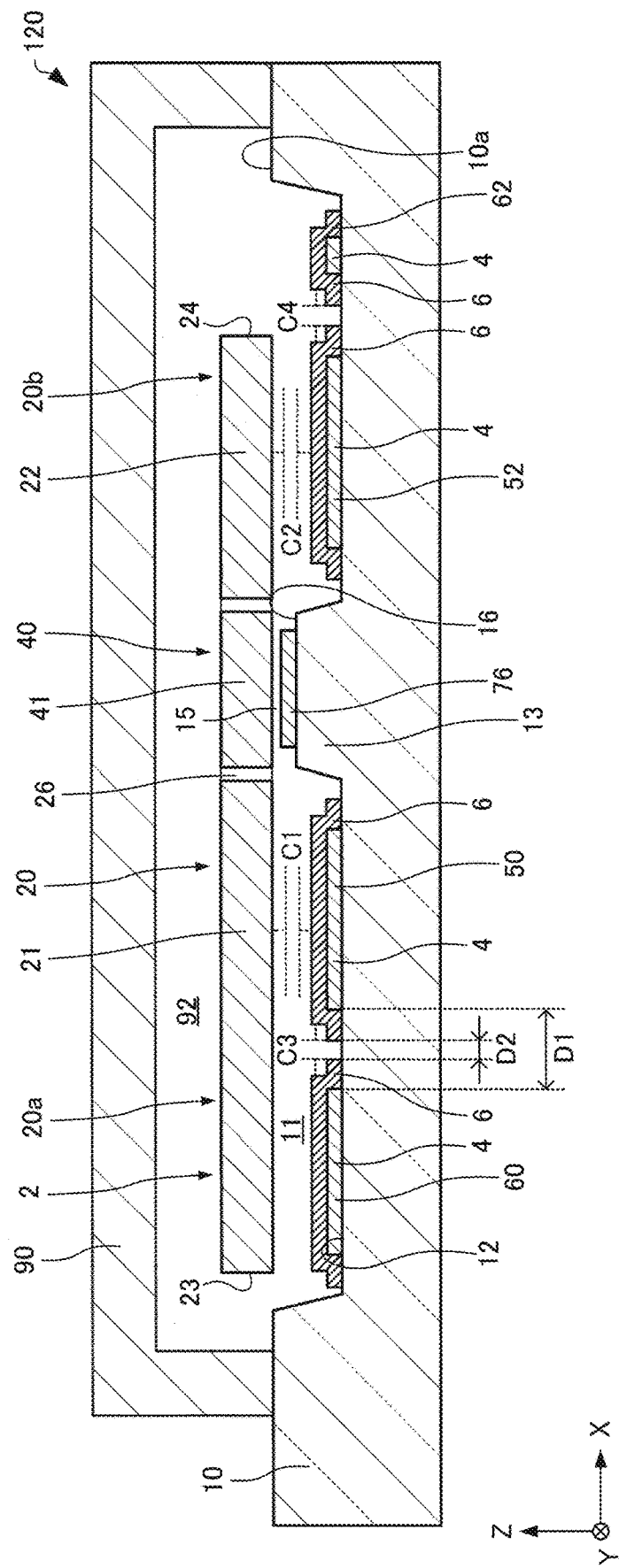
FIG. 25 is a cross-sectional view schematically illustrating a physical quantity sensor according to a second modification example of the first embodiment.
Figure 26:
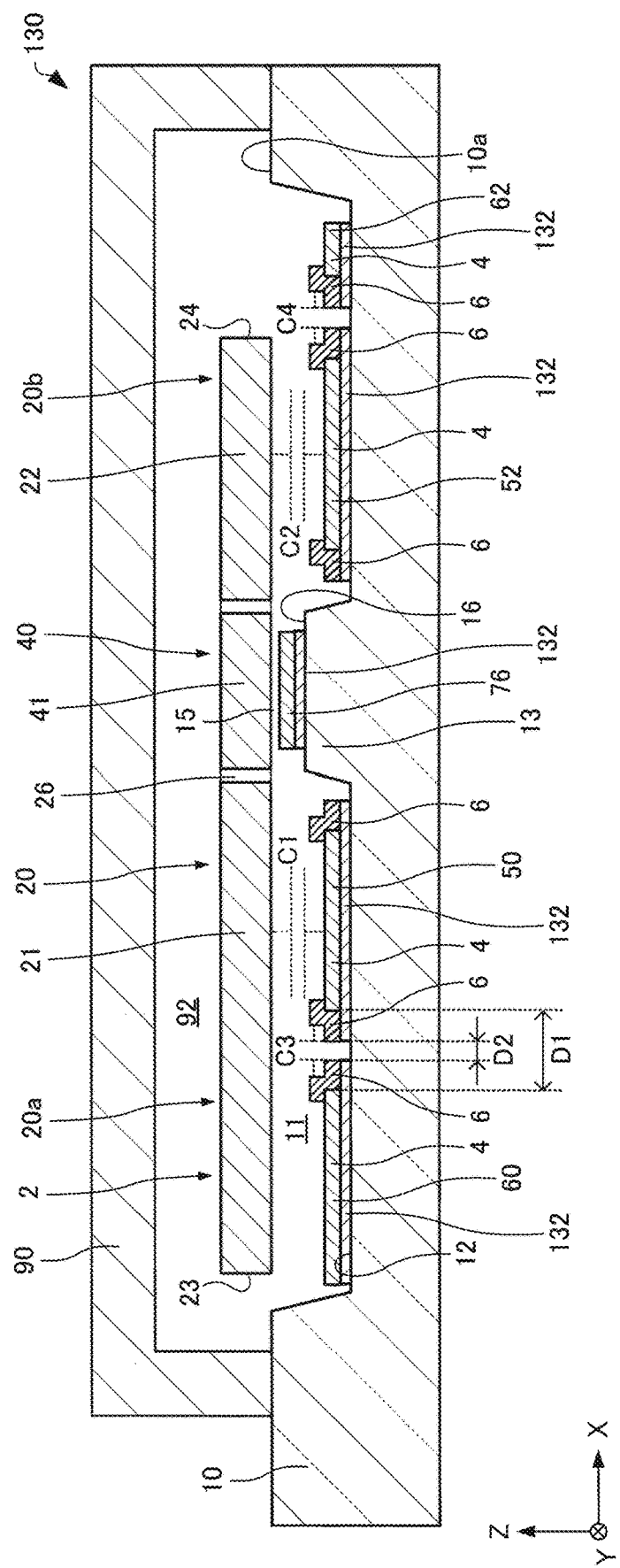
FIG. 26 is a cross-sectional view schematically illustrating a physical quantity sensor according to a third modification example of the first embodiment.

Next, a physical quantity sensor according to a first modification example of the first embodiment will be described with reference to the drawings. FIG. 18 is a cross-sectional view schematically illustrating the physical quantity sensor 110 according to the first modification example of the first embodiment. In FIG. 18 and FIGS. 25 and 26 illustrated below, the X axis, the Y axis, and the Z axis are illustrated as three axes orthogonal to each other.

In the following, in the physical quantity sensor 110 according to the first modification example of the first embodiment, members having the same functions as those of the constituent members of the above-described physical quantity sensor 100 are denoted by the same reference numerals, and a detailed description thereof will be omitted. This is the same in the physical quantity sensors according to the second and third modification examples of the first embodiment to be described later.

As illustrated in FIG. 18, the physical quantity sensor 110 differs from the above-described physical quantity sensor 100 in that it includes an insulating layer 112 provided between the first fixed electrode 50 and the first dummy electrode 60.

In the illustrated example, the insulating layer 112 is provided between the second fixed electrode 52 and the second dummy electrode 62. Although not shown, the insulating layer 112 may be provided between the first fixed electrode 50 and the third dummy electrode 64, and between the second fixed electrode 52 and the third dummy electrode 64. The insulating layer 112 is, for example, a silicon oxide ($SiO_2$) layer.

Next, a manufacturing method of the physical quantity sensor 110 will be described with reference to the drawings. FIG. 19 to FIG. 24 are cross-sectional views schematically illustrating the manufacturing process of the physical quantity sensor 110 according to the first modification example of the first embodiment. Note that FIG. 19 to FIG. 24 show the same cross section as FIG. 7 to FIG. 14.

Figure 19:
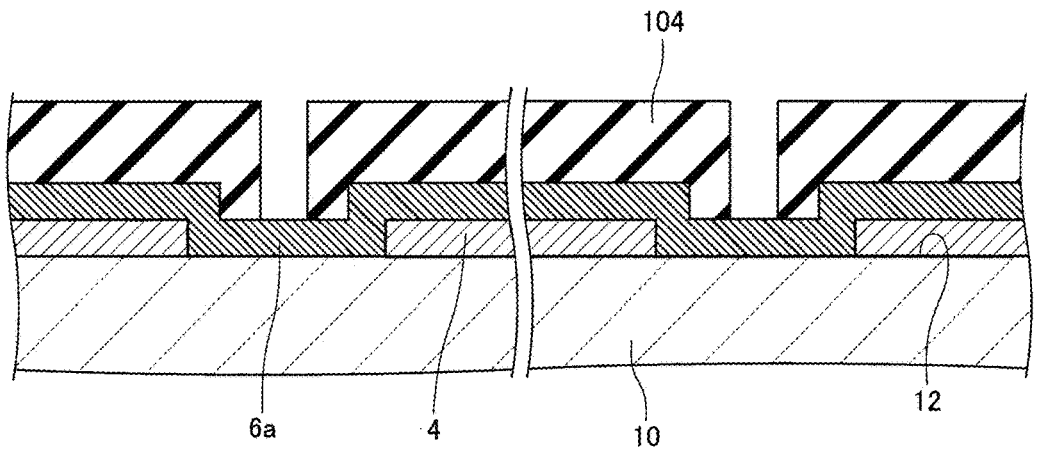
FIG. 19 is a cross-sectional view schematically illustrating a manufacturing process of the physical quantity sensor according to the first modification example of the first embodiment.
Figure 20:
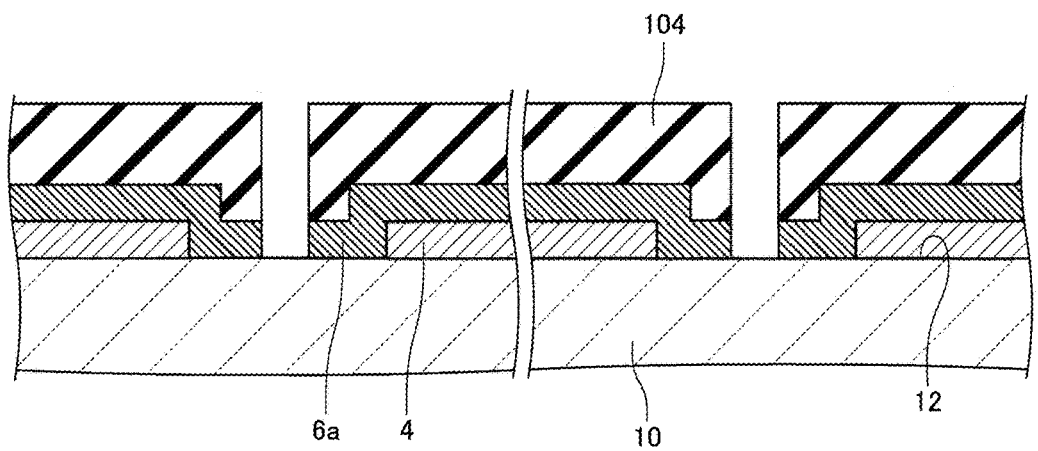
FIG. 20 is a cross-sectional view schematically illustrating the manufacturing process of the physical quantity sensor according to the first modification example of the first embodiment.

In the manufacturing method of the physical quantity sensor 110, as illustrated in FIG. 19, in the above-described step S5, only a part 105a (see FIG. 12) of a section of the second mask material layer 104a not overlapping the first electrode material layer 4 in plan view is removed to form the second mask layer 104. That is, a part 105b (see FIG. 12) of a section of the second mask material layer 104a overlapping the first electrode material layer 4 in plan view is not removed. Therefore, as illustrated in FIG. 20, the second electrode material layer 6 is formed covering the entire top surface of the first electrode material layer 4.

Figure 21:
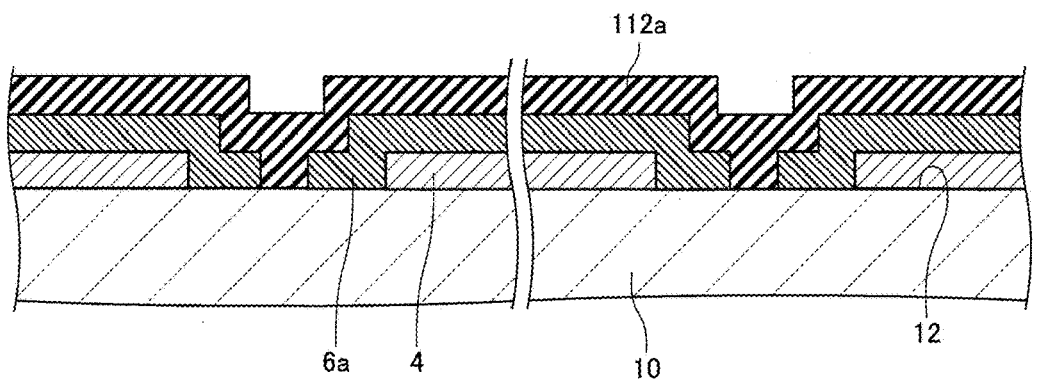
FIG. 21 is a cross-sectional view schematically illustrating the manufacturing process of the physical quantity sensor according to the first modification example of the first embodiment.

Next, after removing the second mask layer 104, as illustrated in FIG. 21, an insulating layer 112a is formed on the substrate 10 and on the second electrode material layer 6. The insulating layer 112a is formed by, for example, a sputtering method, a CVD method, or the like.

Figure 22:
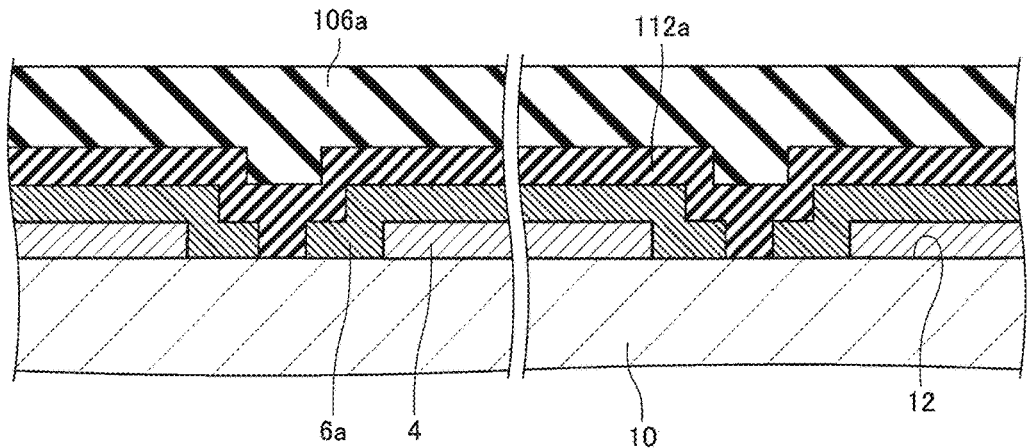
FIG. 22 is a cross-sectional view schematically illustrating the manufacturing process of the physical quantity sensor according to the first modification example of the first embodiment.

Next, as illustrated in FIG. 22, a third mask material layer 106a is formed on the insulating layer 112a by, for example, a spin coat method. The third mask material layer 106a is, for example, a resist layer.

Figure 23:
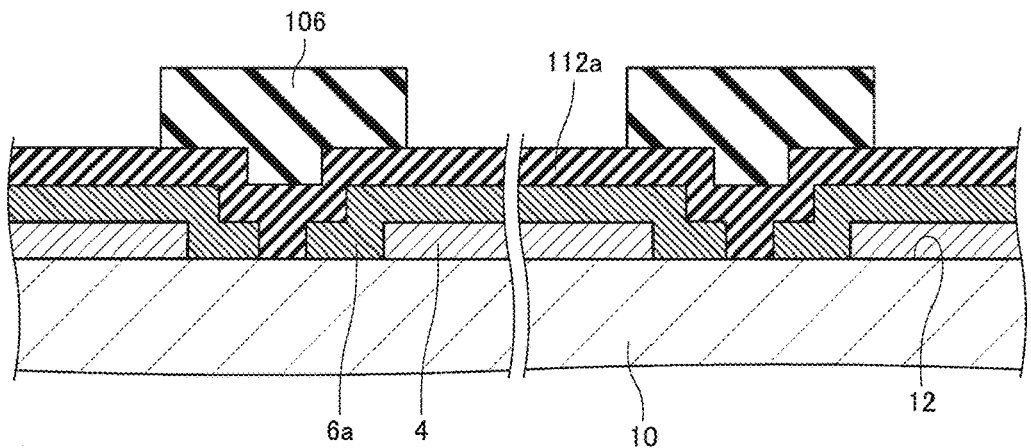
FIG. 23 is a cross-sectional view schematically illustrating the manufacturing process of the physical quantity sensor according to the first modification example of the first embodiment.

Next, as illustrated in FIG. 23, the third mask material layer 106a is patterned by, for example, exposure and development to form a third mask layer 106.

Figure 24:
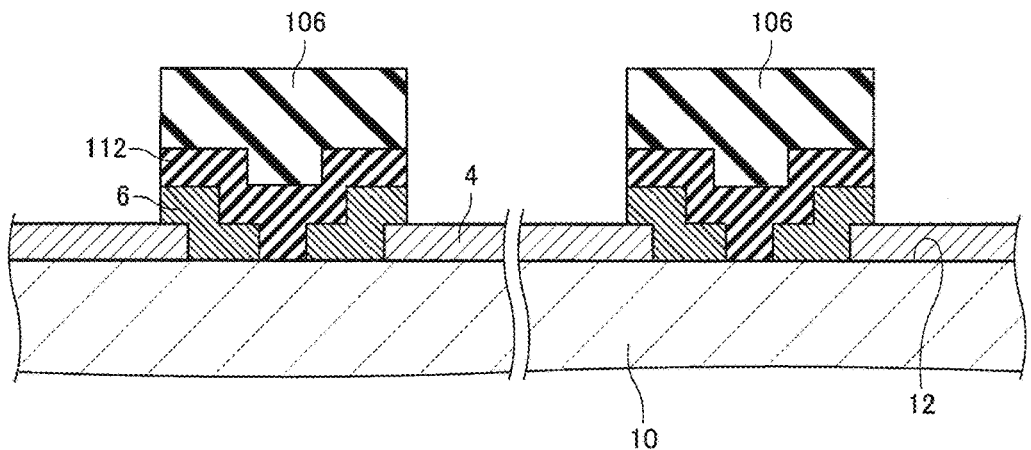
FIG. 24 is a cross-sectional view schematically illustrating the manufacturing process of the physical quantity sensor according to the first modification example of the first embodiment.

Next, as illustrated in FIG. 24, the insulating layer 112a and the second electrode material layer 6 are etched using the third mask layer 106 as a mask. Through this process, the insulating layer 112 can be formed between the first fixed electrode 50 and the first dummy electrode 60. Further, through this process, a part of the top surface of the first electrode material layer 4 is exposed. Next, the third mask layer 106 is immersed in a stripping solution and removed.

Through the above process, the physical quantity sensor 110 can be manufactured.

The physical quantity sensor 110 can have the same effect as the physical quantity sensor 100 described above.

The physical quantity sensor 110 includes an insulating layer 112 provided between the first fixed electrode 50 and the first dummy electrode 60. Therefore, in the physical quantity sensor 110, it is possible to suppress short circuit between the first fixed electrode 50 and the first dummy electrode 60. Similarly, in the physical quantity sensor 110, it is possible to suppress the short circuit of the electrodes 50 and 64, the short circuit of the electrodes 52 and 62, and the short circuit of the electrodes 52 and 64.

Further, since the physical quantity sensor 110 includes the insulating layer 112 provided between the first fixed electrode 50 and the first dummy electrode 60, the capacitance formed by the first fixed electrode 50 and the first dummy electrode 60 can be increased. Similarly, in the physical quantity sensor 110, the capacitance formed by the electrodes 50, 64, the capacitance formed by the electrodes 52, 62, and the capacitance formed by the electrodes 52, 64 can be increased.

1.3.2. Second Modification Example

Next, a physical quantity sensor according to a second modification example of the first embodiment will be described with reference to the drawings. FIG. 25 is a cross-sectional view schematically illustrating the physical quantity sensor 120 according to the second modification example of the first embodiment.

In the physical quantity sensor 100 described above, as illustrated in FIG. 2, apart of the top surface of the first electrode material layer 4 constituting the fixed electrodes 50, 52 is exposed. On the other hand, in the physical quantity sensor 120, as illustrated in FIG. 25, the entire surface of the top surface of the first electrode material layer 4 constituting the fixed electrodes 50, 52 is covered with the second electrode material layer 6.

In the illustrated example, the entire surface of the top surface of the first electrode material layer 4 constituting the dummy electrodes 60, 62 is also covered with the second electrode material layer 6. Although not shown, the entire surface of the top surface of the first electrode material layer 4 constituting the third dummy electrode 64 may also be covered with the second electrode material layer 6.

In the physical quantity sensor 120, as illustrated in FIG. 19, in the above-described step S5, only a part 105a (see FIG. 12) of a section of the second mask material layer 104a not overlapping the first electrode material layer 4 in plan view is removed to form the second mask layer 104.

The physical quantity sensor 120 can have the same effect as the physical quantity sensor 100 described above.

In the physical quantity sensor 120, the entire surface of the top surface of the first electrode material layer 4 constituting the fixed electrodes 50, 52 is covered with the second electrode material layer 6. Therefore, no step is formed by the electrode material layers 4 and 6 on the top surfaces of the fixed electrodes 50, 52. Thus, in the physical quantity sensor 120, the top surfaces of the fixed electrodes 50 and 52 can be made flat, and for example, the capacitances C1 and C2 can be easily calculated by simulation or the like.

Although not shown, in the physical quantity sensor 120, the insulating layer 112 may be provided between the first fixed electrode 50 and the first dummy electrode 60 as in the physical quantity sensor 110 illustrated in FIG. 18.

1.3.3. Third Modification Example

Next, a physical quantity sensor according to a third modification example of the first embodiment will be described with reference to the drawings. FIG. 26 is a cross-sectional view schematically illustrating the physical quantity sensor 130 according to the third modification example of the first embodiment.

The physical quantity sensor 130 is different from the above-described physical quantity sensor 100 in that it includes an adhesive layer 132 provided between the substrate 10 and the first electrode material layer 4 as illustrated in FIG. 26.

The adhesive layer 132 brings the substrate 10 and the first electrode material layer 4 into close contact with each other. The first electrode material layer 4 is provided on the substrate 10 through the adhesive layer 132. The adhesive layers 132 respectively constituting the fixed electrode 50, 52 and the dummy electrodes 60, 62, and 64 are provided so as to be separated from each other. The adhesive layer 132 is also provided, for example, between the substrate 10 and the wirings 70, 72, 74, and 76. The adhesive layer 132 is, for example, a titanium (Ti) layer.

The adhesive layer 132 is formed on the substrate 10 before the formation of the first mask layer 102 (step S2) (before the electrode forming process). The adhesive layer 132 is formed by, for example, film formation by a sputtering method, a CVD method, or the like, and patterning by photolithography and etching. In the forming the first electrode material layer 4 (step S3), the first conductive layer 4a is formed on the adhesive layer 132.

The physical quantity sensor 130 can have the same effect as the physical quantity sensor 100 described above.

The physical quantity sensor 130 includes an adhesive layer 132 provided between the substrate 10 and the first electrode material layer 4 to bring the substrate 10 and the first electrode material layer 4 into close contact with each other. Therefore, in the physical quantity sensor 130, it is possible to improve adhesion between the substrate 10 and the first electrode material layer 4. In particular, in a case where the material of the substrate 10 is glass and the material of the first electrode material layer 4 is platinum, if the first electrode material layer 4 is directly provided on the substrate 10, adhesion is poor, so it is preferable to provide the adhesive layer 132.

In the illustrated example, the adhesive layer 132 is also provided between the substrate 10 and the second electrode material layer 6. However, in a case where the adhesion between the substrate 10 and the second electrode material layer 6 is high, the adhesive layer 132 may not be provided therebetween.

Although not shown, in the physical quantity sensor 130, the insulating layer 112 may be provided between the first fixed electrode 50 and the first dummy electrode 60 as in the physical quantity sensor 110 illustrated in FIG. 18.

Although not shown, in the physical quantity sensor 130, as in the physical quantity sensor 120 illustrated in FIG. 25, the entire surface of the top surface of the first electrode material layer 4 constituting the fixed electrodes 50, 52 may be covered with the second electrode material layer 6.

2. Second Embodiment 2.1. Physical Quantity Sensor

Figure 27:
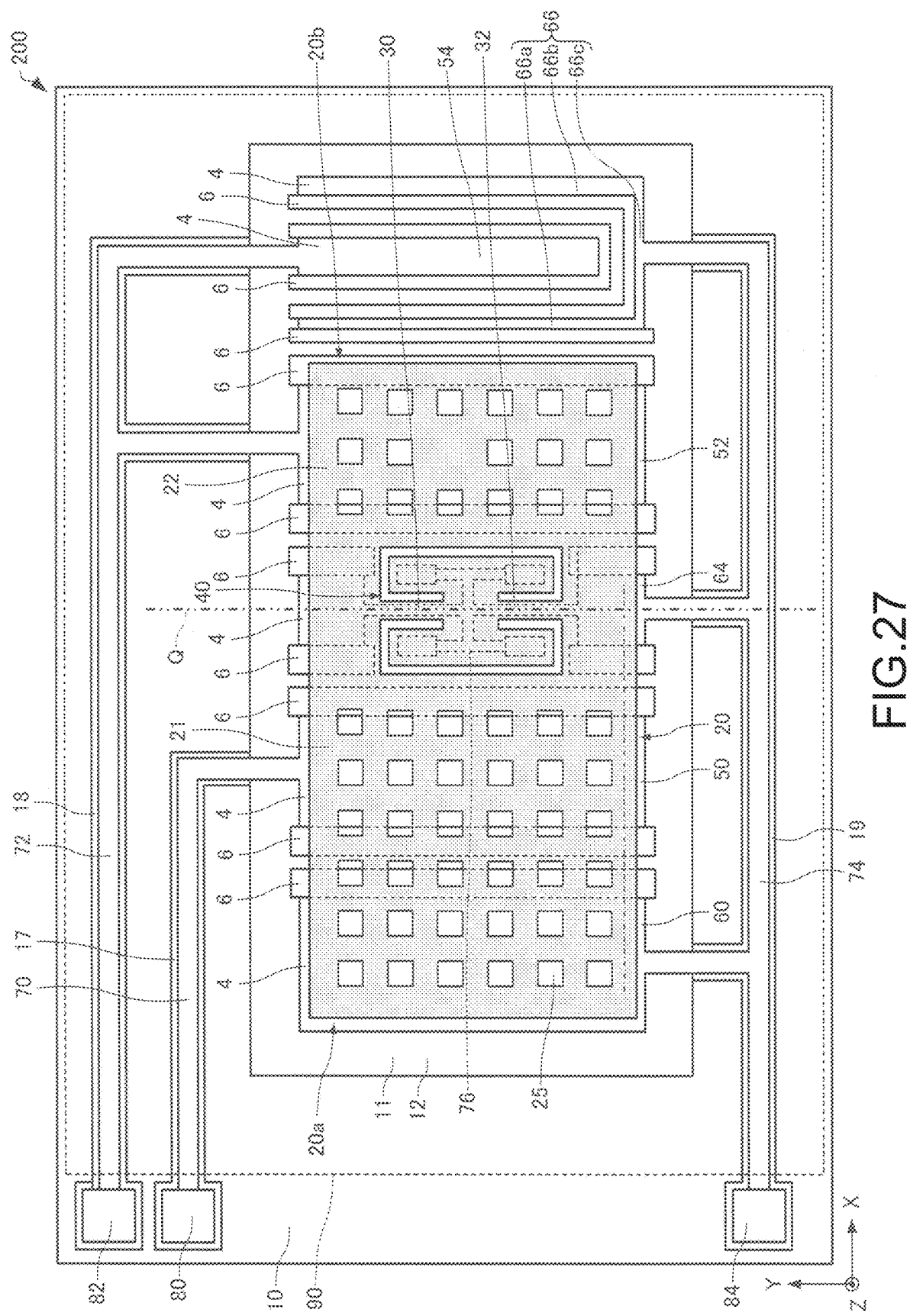
FIG. 27 is a plan view schematically illustrating a physical quantity sensor according to a second embodiment.

Next, a physical quantity sensor according to a second embodiment will be described with reference to the drawings. FIG. 27 is a plan view schematically illustrating a physical quantity sensor 200 according to the second embodiment. For the sake of convenience, FIG. 27 shows the lid body 90 in perspective. In FIG. 27, the X axis, the Y axis, and the Z axis are illustrated as three axes orthogonal to each other.

In the following, in the physical quantity sensor 200 according to the second embodiment, members having the same functions as those of the constituent members of the above-described physical quantity sensor 100 are denoted by the same reference numerals, and a detailed description thereof will be omitted.

The physical quantity sensor 200 differs from the physical quantity sensor 100 described above in that it includes a third fixed electrode 54 and a fourth dummy electrode 66 as illustrated in FIG. 27. In the illustrated example, in the physical quantity sensor 200, the second dummy electrode 62 is not provided.

The third fixed electrode 54 and the fourth dummy electrode 66 are fixed to the substrate 10. The third fixed electrode 54 and the fourth dummy electrode 66 are provided on the substrate 10. In the illustrated example, the third fixed electrode 54 and the fourth dummy electrode 66 are provided on the bottom surface 12 of the recessed portion 11.

The third fixed electrode 54 is provided on the other side (+X-axis direction side in the illustrated example) in a direction intersecting with the extending direction of the support axis Q. The third fixed electrode 54 does not overlap the movable body 20 in plan view. That is, the third fixed electrode 54 is provided outside the outer edge of the movable body 20 in plan view. In the illustrated example, the third fixed electrode 54 is electrically connected to the second fixed electrode 52 through the second wiring 72.

The third fixed electrode 54 has a shape in which a longitudinal direction corresponds to the extending direction of the support axis Q (the Y-axis direction in the illustrated example) in plan view. The third fixed electrode 54 has, for example, a rectangular shape in plan view. The third fixed electrode 54 is formed by the same process as the fixed electrodes 50 and 52, for example.

The fourth dummy electrode 66 is electrically connected to the movable body 20. The fourth dummy electrode 66 has the same potential as the movable body 20, for example. The fourth dummy electrode 66 is formed by the same process as the dummy electrodes 60, 64, for example.

The fourth dummy electrode 66 is provided on the other side (in the illustrated example, +X-axis direction side) of the direction intersecting the extending direction of the support axis Q in plan view. In the illustrated example, the fourth dummy electrode 66 is provided on the +X-axis direction side of the second fixed electrode 52. The fourth dummy electrode 66 does not overlap the movable body 20 in plan view. Although not shown, the fourth dummy electrode 66 may overlap the movable body 20 in plan view.

The fourth dummy electrode 66 is provided adjacent to the third fixed electrode 54. In the illustrated example, the fourth dummy electrode 66 is electrically connected to the movable body 20 through a third wiring 74, a third dummy electrode 64, a fourth wiring 76, a support portion 40, and connecting portions 30, 32.

The fourth dummy electrode 66 includes a first part 66a, a second part 66b, and a third part 66c.

The first part 66a of the fourth dummy electrode 66 is provided on the −X-axis direction side of the third fixed electrode 54. The first part 66a has a shape having a longitudinal direction in the Y-axis direction in plan view, and has a rectangular shape in the illustrated example. The first part 66a is provided between the second fixed electrode 52 and the third fixed electrode 54.

The second part 66b of the fourth dummy electrode 66 is provided on the +X-axis direction side of the third fixed electrode 54. The second part 66b has a shape having a longitudinal direction in the Y-axis direction in plan view, and has a rectangular shape in the illustrated example.

The third part 66c of the fourth dummy electrode 66 is provided on the −Y-axis direction side of the third fixed electrode 54. The third part 66c has a shape having a longitudinal direction in the X-axis direction in plan view, and has a rectangular shape in the illustrated example. The third part 66c connects the first part 66a with the second part 66b. The fourth dummy electrode 66 has a C shape (substantially C shape) in plan view.

The second fixed electrode 52 is provided between the first fixed electrode 50 and the third fixed electrode 54. The first part 66a of the fourth dummy electrode 66 is provided between the second fixed electrode 52 and the third fixed electrode 54.

The fourth dummy electrode 66 forms a capacitance with the third fixed electrode 54. Further, the fourth dummy electrode 66 forms a capacitance with the second fixed electrode 52.

The third fixed electrode 54 and the fourth dummy electrode 66 includes a first electrode material layer 4 and a second electrode material layer 6.

The second electrode material layer 6 constituting the third fixed electrode 54 and the second electrode material layer 6 constituting the fourth dummy electrode 66 are provided between the first electrode material layer 4 constituting the third fixed electrode 54 and the first electrode material layer 4 constituting the fourth dummy electrode 66. Further, the second electrode material layer 6 constituting the second fixed electrode 52 and the second electrode material layer 6 constituting the fourth dummy electrode 66 are provided between the first electrode material layer 4 constituting the second fixed electrode 52 and the first electrode material layer 4 constituting the fourth dummy electrode 66.

The physical quantity sensor 200 can have the same effect as the physical quantity sensor 100 described above.

The physical quantity sensor 200 includes a third fixed electrode 54 which is fixed to the substrate 10, does not overlap the movable body 20 in plan view, and is electrically connected to the second fixed electrode 52, and a fourth dummy electrode 66 which is fixed to the substrate 10, is provided adjacent to the third fixed electrode 54, and is electrically connected to the movable body 20. For example, in the physical quantity sensor 200, in the case where the third fixed electrode 54 is not provided, in a state where no acceleration is applied, the first capacitance detected by the pads 80 and 84 is larger than the second capacitance detected by the pads 82 and 84. In the physical quantity sensor 200, by providing the third fixed electrode 54 electrically connected to the second fixed electrode 52, it is possible to form the capacitance by the third fixed electrode 54 and the fourth dummy electrode 66, the second capacitance can be increased. Therefore, in the physical quantity sensor 200, the capacitance offset can be reduced.

For example, first, a physical quantity sensor without the third fixed electrode 54 is manufactured, and then, in a state where no acceleration is applied, the capacitance offset of the physical quantity sensor is measured. In a case where the first capacitance is larger than the second capacitance, a third fixed electrode 54 is provided to manufacture a physical quantity sensor 200 having a small capacitance offset. As described above, the capacitance offset of the physical quantity sensor without the third fixed electrode 54 may actually be obtained by manufacturing a physical quantity sensor without the third fixed electrode 54 and measuring it, or by simulation.

Further, in the physical quantity sensor 200, since the third fixed electrode 54 does not overlap the movable body 20 in plan view, it is possible to suppress formation of capacitance by the movable body 20 and the third fixed electrode 54. Therefore, in the physical quantity sensor 200, for example, even in a case where the movable body 20 is displaced, the capacitance offset of the first capacitance and the second capacitance can be easily adjusted using the third fixed electrode 54.

In the physical quantity sensor 200, the third fixed electrode 54 has a shape including a longitudinal direction in the Y-axis direction in plan view, and the fourth dummy electrode 66 includes a first part 66a provided on the −X-axis direction side of the third fixed electrode 54, a second part 66b provided on the +X-axis direction side of the third fixed electrode 54, and a third part 66c which is provided on the −Y-axis direction side of the third fixed electrode 54 and connects the first part 66a and the second part 66b. Therefore, in the physical quantity sensor 200, for example, the capacitance formed by the third fixed electrode 54 and the fourth dummy electrode 66 can be increased as compared with the case where the fourth dummy electrode 66 has only the first part 66a. Further, since the fourth dummy electrode 66 is not provided on the +Y-axis direction side of the third fixed electrode 54, it is easy to connect the third fixed electrode 54 with the second wiring 72 (it is possible to facilitate the routing of the second wiring 72 to the third fixed electrode 54).

In the physical quantity sensor 200, the third fixed electrode 54 is provided on the +X-axis direction side of the support axis Q in plan view, the second fixed electrode 52 is provided between the first fixed electrode 50 and the third fixed electrode 54, and the first part 66a of the fourth dummy electrode 66 is provided between the second fixed electrode 52 and the third fixed electrode 54. Therefore, in the physical quantity sensor 200, the capacitance can be formed by the second fixed electrode 52 and the fourth dummy electrode 66.

Although not shown, in the physical quantity sensor 200, the insulating layer 112 may be provided between the first fixed electrode 50 and the first dummy electrode 60 as in the physical quantity sensor 110 illustrated in FIG. 18.

Although not shown, in the physical quantity sensor 200, as in the physical quantity sensor 120 illustrated in FIG. 25, the entire surface of the top surface of the first electrode material layer 4 constituting the fixed electrodes 50, 52, and 54 may be covered with the second electrode material layer 6.

Although not shown, in the physical quantity sensor 200, an adhesive layer 132 may be provided between the substrate 10 and the first electrode material layer 4 as in the physical quantity sensor 130 illustrated in FIG. 26.

2.2. Physical Quantity Sensor Manufacturing Method

Next, a manufacturing method of the physical quantity sensor 200 according to the second embodiment will be described. The manufacturing method of the physical quantity sensor 200 according to the second embodiment is basically the same as the manufacturing method of the physical quantity sensor 100 according to the first embodiment described above, except that the third fixed electrode 54 and the fourth dummy electrode 66 are formed. Therefore, a detailed description thereof will be omitted.

2.3. Modification Example of Physical Quantity Sensor

2.3.1. First Modification Example

Figure 28:
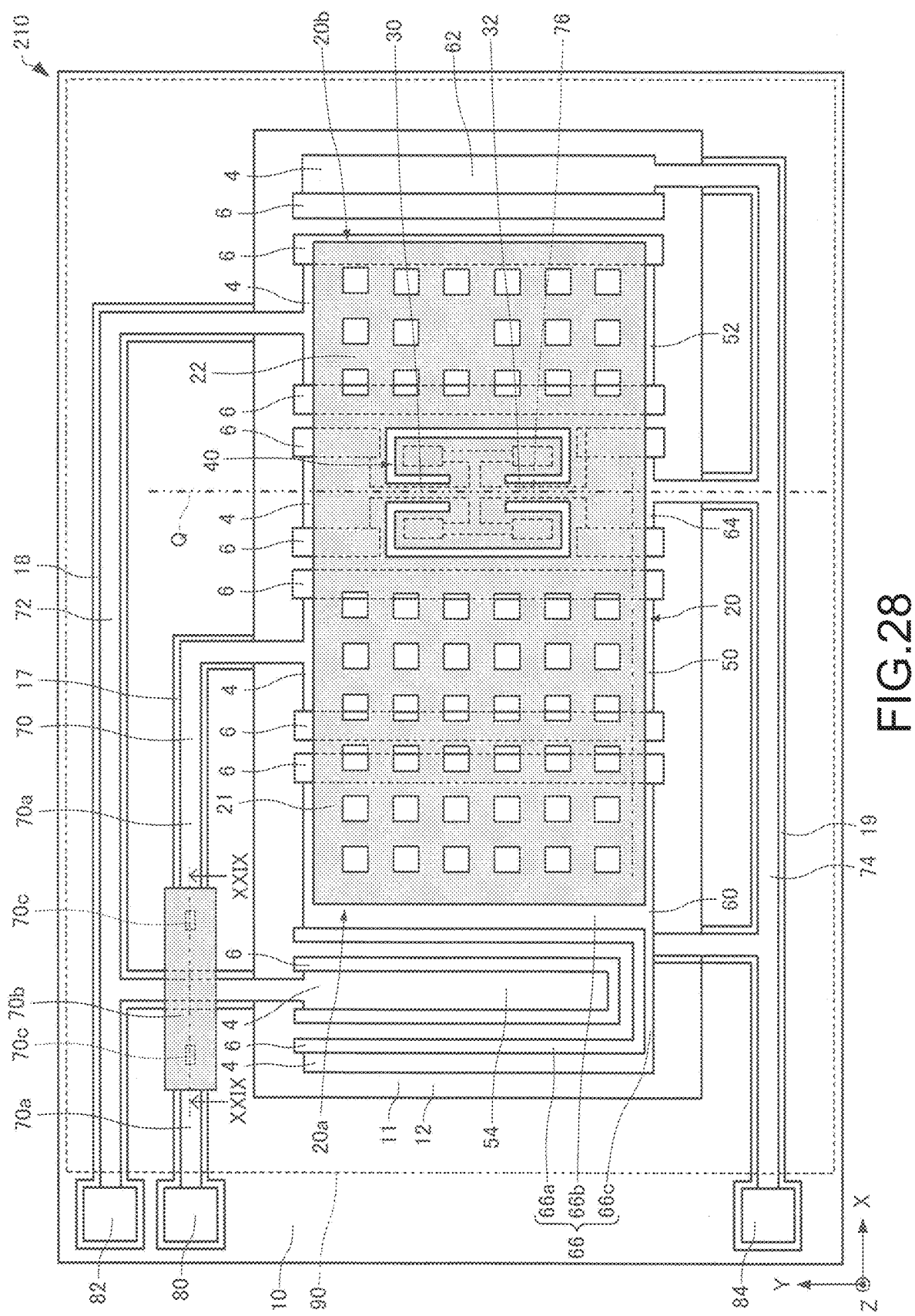
FIG. 28 is a plan view schematically illustrating a physical quantity sensor according to a first modification example of the second embodiment.
Figure 29:
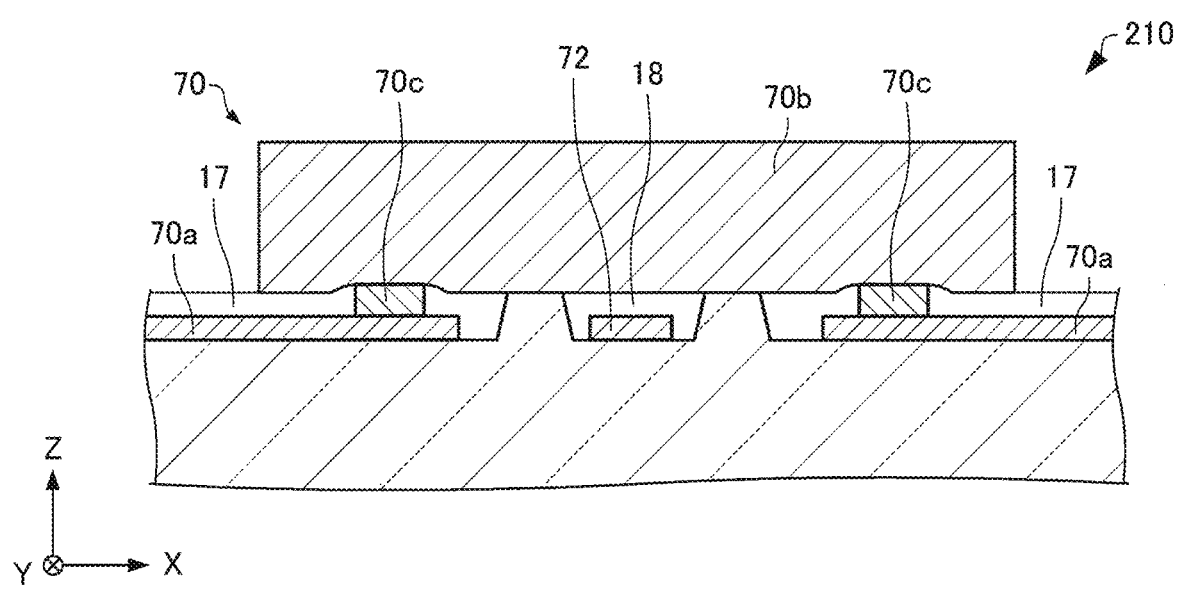
FIG. 29 is a cross-sectional view schematically illustrating the physical quantity sensor according to the first modification example of the second embodiment.

Next, a physical quantity sensor according to a first modification example of the second embodiment will be described with reference to the drawings. FIG. 28 is a plan view schematically illustrating a physical quantity sensor 210 according to the first modification example of the second embodiment. FIG. 29 is a cross-sectional view taken along the line XXIX-XXIX of FIG. 28 schematically illustrating a physical quantity sensor 210 according to the first modification example of the second embodiment. For the sake of convenience, FIG. 28 and FIGS. 30 and 31 to be illustrated below illustrate a lid body 90 in perspective. In FIG. 29, the illustration of the lid body 90 is omitted. In FIGS. 28 and 29 and FIGS. 30 and 31 illustrated below, the X axis, the Y axis, and the Z axis are illustrated as three axes orthogonal to each other.

In the following, in the physical quantity sensor 210 according to the first modification example of the second embodiment, members having the same functions as those of the constituent members of the above-described physical quantity sensors 100 and 200 are denoted by the same reference numerals, and a detailed description thereof will be omitted.

In the physical quantity sensor 200 described above, as illustrated in FIG. 27, the third fixed electrode 54 is provided on the other side (+X-axis direction side) of the direction intersecting the extending direction of the support axis Q in plan view. On the other hand, in the physical quantity sensor 210, as illustrated in FIG. 28, the third fixed electrode 54 is disposed on one side (−X-axis direction side) of the direction intersecting the extending direction of the support axis Q in plan view. The physical quantity sensor 200 includes a second dummy electrode 62.

In the physical quantity sensor 200, the first dummy electrode 60 is provided between the first fixed electrode 50 and the third fixed electrode 54. The first dummy electrode 60 and the fourth dummy electrode 66 are connected to each other. In the illustrated example, the first dummy electrode 60 and the second part 66b of the fourth dummy electrode 66 are connected to each other.

As illustrated in FIG. 28 and FIG. 29, the first wiring 70 includes a metal portion 70a, a silicon portion 70b, and a bump portion 70c. The metal portion 70a is provided in the first groove portion 17. The silicon portion 70b is not provided in the first groove portion 17. The silicon portion 70b is provided on the top surface 10a of the substrate 10. The silicon portion 70b intersects the second wiring 72 in plan view. The silicon portion 70b is provided above the second wiring 72 so as to be separated from the second wiring 72. The bump portion 70c connects the metal portion 70a with the silicon portion 70b. The bump portion 70c is provided in the first groove portion 17. In the illustrated example, the top surface of the bump portion 70c is located above the top surface of the substrate 10.

The material of the metal portion 70a is, for example, the same as the materials of the wirings 72 and 74 and the wiring layer portion 76a. The material of the silicon portion 70b is, for example, the same as the material of the movable body 20. The material of the bump portion 70c is, for example, the same as the material of the bump portion 76b. The metal portion 70a is formed by the same process as that of, for example, the wirings 72 and 74 and the wiring layer portion 76a. The silicon portion 70b is formed, for example, by patterning the silicon substrate 8 (see FIG. 16). The bump portion 70c is formed by the same process as that of, for example, the bump portion 76b.

The physical quantity sensor 210 can have the same effect as the physical quantity sensor 200 described above.

Although not illustrated, instead of the first wiring 70, the second wiring 72 may have a metal portion, a silicon portion, and a bump portion as described above.

Although not illustrated, the third fixed electrode 54 and the fourth dummy electrode 66 may be provided also on the +X-axis direction side of the second fixed electrode 52 as in the physical quantity sensor 200 illustrated in FIG. 27. That is, the physical quantity sensor according to the invention may be a combination of the physical quantity sensor 200 and the physical quantity sensor 210. In this case, the fourth dummy electrode 66 may not be provided.

2.3.2. Second Modification Example

Figure 30:
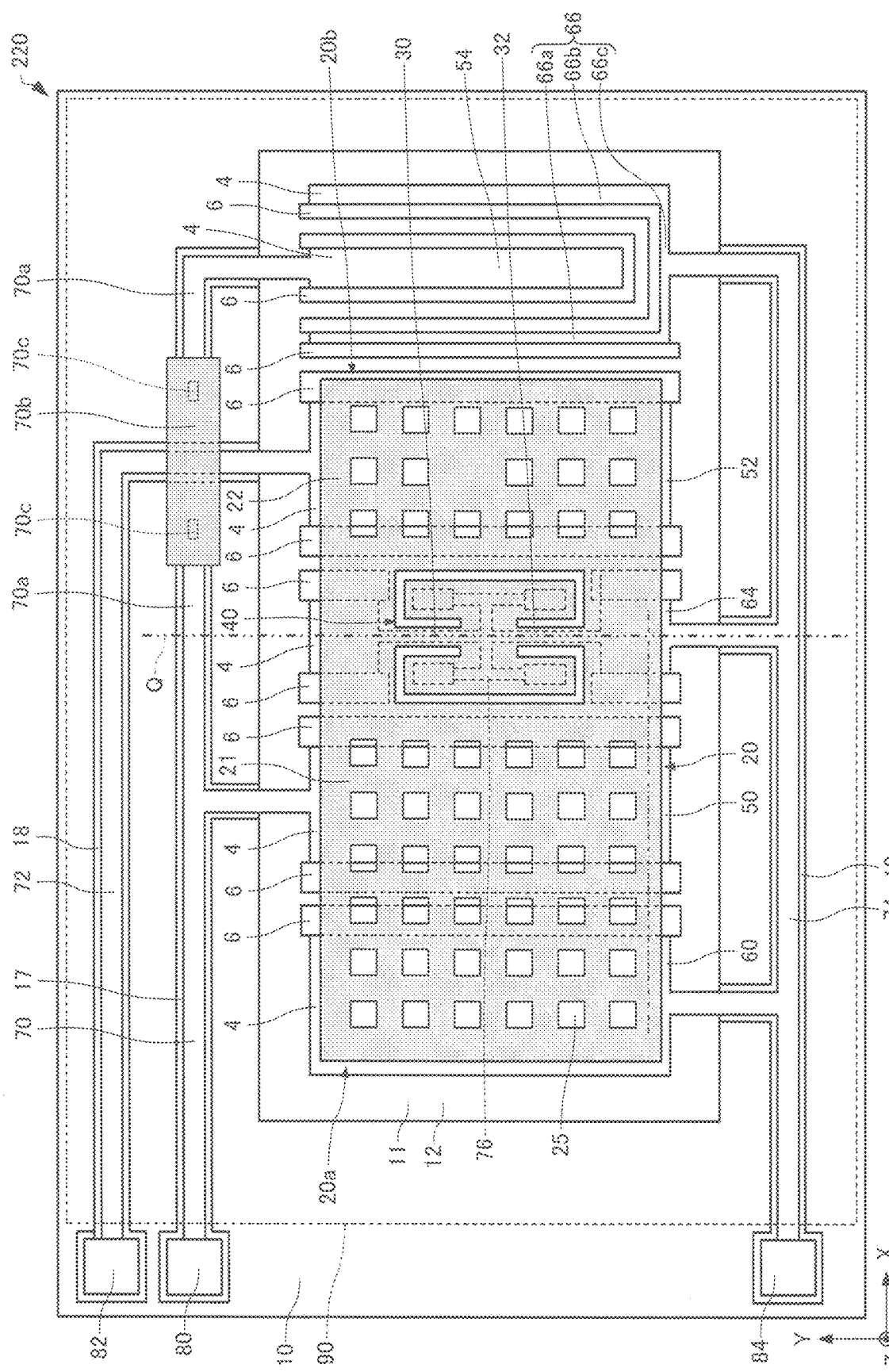
FIG. 30 is a plan view schematically illustrating a physical quantity sensor according to a second modification example of the second embodiment.

Next, a physical quantity sensor according to a second modification example of the second embodiment will be described with reference to the drawings. FIG. 30 is a plan view schematically illustrating a physical quantity sensor 220 according to the second modification example of the second embodiment.

In the following, in the physical quantity sensor 220 according to the second modification example of the second embodiment, members having the same functions as those of the constituent members of the above-described physical quantity sensors 100, 200, and 210 are denoted by the same reference numerals, and a detailed description thereof will be omitted.

In the physical quantity sensor 200 described above, as illustrated in FIG. 27, the third fixed electrode 54 is electrically connected to the second fixed electrode 52 through the second wiring 72. On the other hand, in the physical quantity sensor 220, as illustrated in FIG. 30, the third fixed electrode 54 is electrically connected to the first fixed electrode 50 through the first wiring 70. The first wiring 70 includes a metal portion 70a, a silicon portion 70b, and a bump portion 70c.

In the physical quantity sensor 220, in the case where the third fixed electrode 54 is not provided, in a state where no acceleration is applied, the first capacitance detected by the pads 80 and 84 is smaller than the second capacitance detected by the pads 82 and 84. In the physical quantity sensor 120, by providing the third fixed electrode 54 electrically connected to the first fixed electrode 50, it is possible to form the capacitance by the third fixed electrode 54 and the fourth dummy electrode 66, the first capacitance can be increased. Therefore, in the physical quantity sensor 220, the capacitance offset can be reduced.

2.3.3. Third Modification Example

Figure 31:
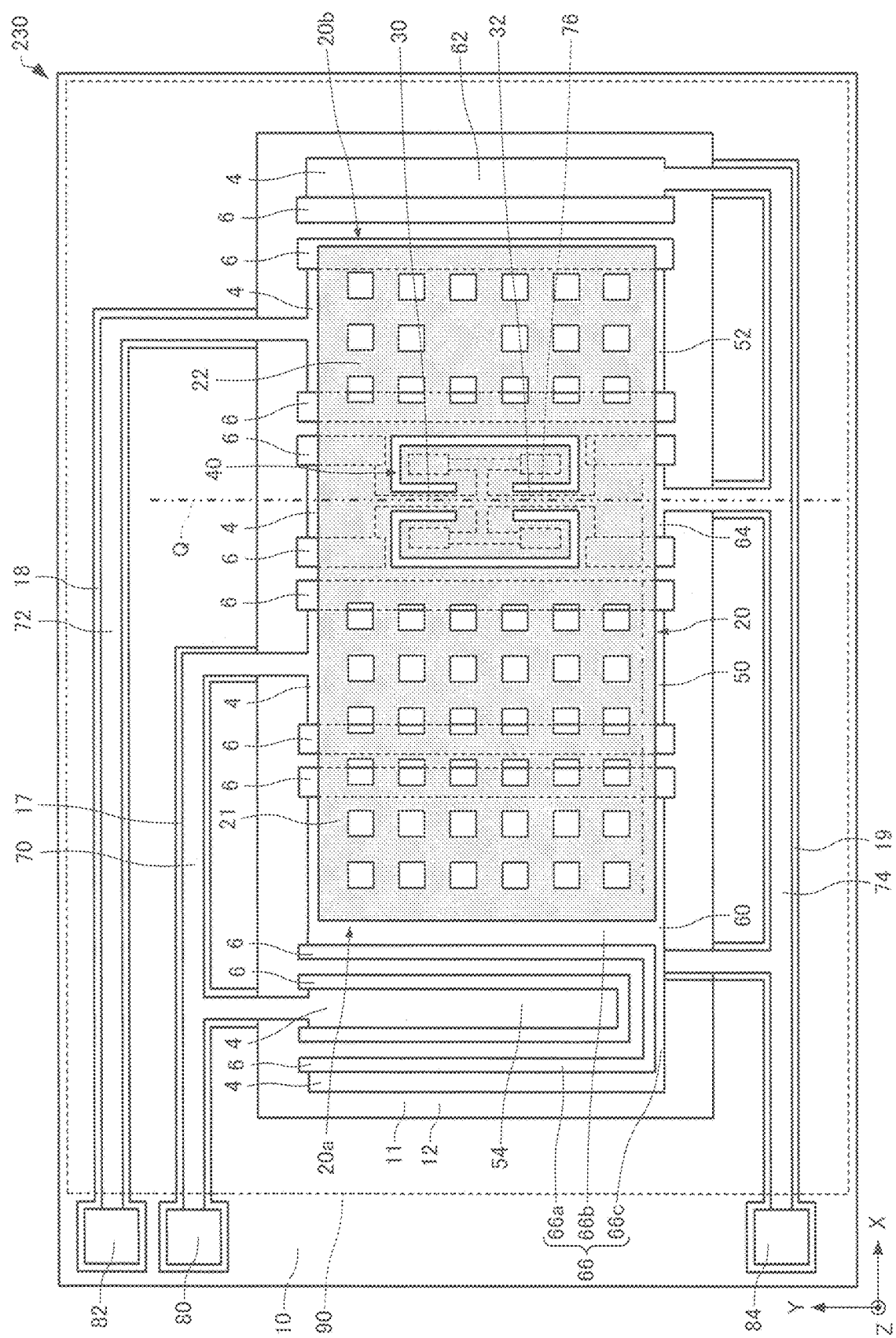
FIG. 31 is a plan view schematically illustrating a physical quantity sensor according to a third modification example of the second embodiment.

Next, a physical quantity sensor according to a third modification example of the second embodiment will be described with reference to the drawings. FIG. 31 is a plan view schematically illustrating a physical quantity sensor 230 according to the third modification example of the second embodiment.

In the following, in the physical quantity sensor 230 according to the third modification example of the second embodiment, members having the same functions as those of the constituent members of the above-described physical quantity sensors 100, 200, 210, and 220 are denoted by the same reference numerals, and a detailed description thereof will be omitted.

In the physical quantity sensor 200 described above, as illustrated in FIG. 27, the third fixed electrode 54 is provided on the other side (+X-axis direction side) of the direction intersecting the extending direction of the support axis Q in plan view. Further, in the physical quantity sensor 200, as illustrated in FIG. 27, the third fixed electrode 54 is electrically connected to the second fixed electrode 52 through the second wiring 72.

On the other hand, in the physical quantity sensor 230, as illustrated in FIG. 31, the third fixed electrode 54 is disposed on one side (−X-axis direction side) of the direction intersecting the extending direction of the support axis Q in plan view. Further, in the physical quantity sensor 230, the third fixed electrode 54 is electrically connected to the first fixed electrode 50 through a first wiring 70. The physical quantity sensor 230 includes a second dummy electrode 62.

The physical quantity sensor 230 can have the same effect as the physical quantity sensor 220 described above.

Although not illustrated, the third fixed electrode 54 and the first dummy electrode 60 may be provided also on the +X-axis direction side of the second fixed electrode 52 as in the physical quantity sensor 220 illustrated in FIG. 30. That is, the physical quantity sensor according to the invention may be a combination of the physical quantity sensor 220 and the physical quantity sensor 230. In this case, the second dummy electrode 62 may not be provided.

3. Third Embodiment

3.1. Physical Quantity Sensor

Figure 32:
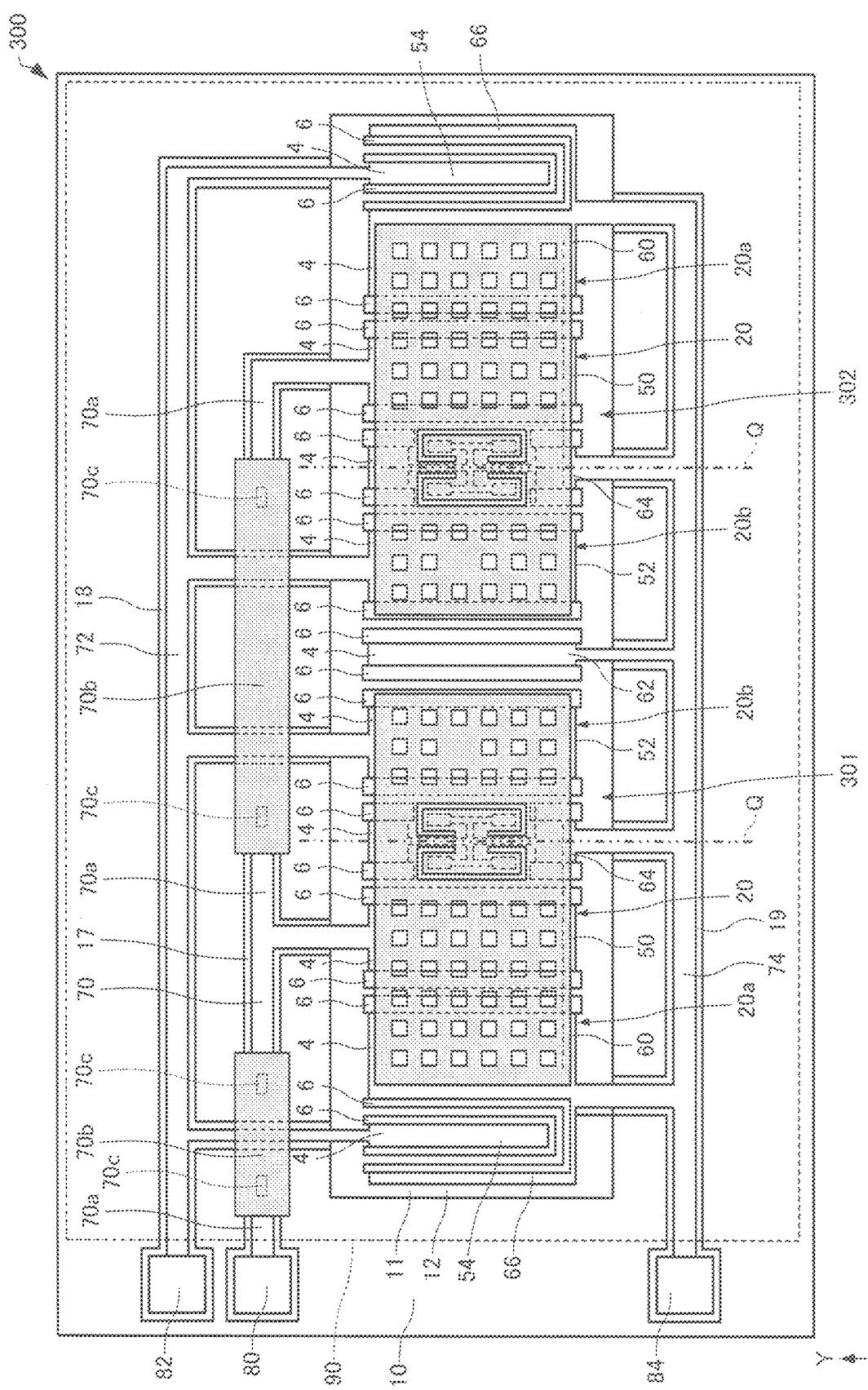
FIG. 32 is a plan view schematically illustrating a physical quantity sensor according to a third embodiment.

Next, a physical quantity sensor according to a third embodiment will be described with reference to the drawings. FIG. 32 is a plan view schematically illustrating a physical quantity sensor 300 according to the third embodiment. For the sake of convenience, FIG. 32 shows the lid body 90 in perspective. In FIG. 32, the X axis, the Y axis, and the Z axis are illustrated as three axes orthogonal to each other.

In the following, in the physical quantity sensor 300 according to the third embodiment, members having the same functions as those of the constituent members of the above-described physical quantity sensors 100, 200, 210, 220, and 230 are denoted by the same reference numerals, and a detailed description thereof will be omitted.

In the physical quantity sensor 200 described above, as illustrated in FIG. 27, one movable body 20 is provided. On the other hand, in the physical quantity sensor 300, as illustrated in FIG. 32, two movable bodies 20 are provided.

In the physical quantity sensor 300, two structures (a first structure 301 and a second structure 302) each including the movable body 20, the connecting portions 30 and 32, the support portion 40, the fixed electrodes 50, 52, and 54, the dummy electrodes 60, 62, 64, and 66, and the fourth wiring 76. The structures 301 and 302 are arranged in the X-axis direction. That is, the two movable bodies 20 are arranged along a direction orthogonal to the extending direction of the support axis Q. The structures 301 and 302 are provided line-symmetrically with respect to a virtual axis (not shown) parallel to the Y axis in plan view. The first structure 301 is provided on the −X-axis direction side with respect to the second structure 302.

In the illustrated example, the second dummy electrode 62 of the first structure 301 and the second dummy electrode 62 of the second structure 302 are integrally provided and constitute a common second dummy electrode 62. Thus, in the physical quantity sensor 300, the number of parts can be reduced and the size can be reduced. Although not illustrated, the second dummy electrode 62 of the first structure 301 and the second dummy electrode 62 of the second structure 302 do not constitute a common second dummy electrode 62, and may be provided one by one in the structures 301 and 302.

The third fixed electrode 54 and the fourth dummy electrode 66 of the first structure 301 are provided on the −X-axis direction side of the first fixed electrode 50 of the first structure 301, and the third fixed electrode 54 and the fourth dummy electrode 66 of the second structure 302 are provided on the +X-axis direction side of the first fixed electrode 50 of the second structure 302. The third fixed electrode 54 is electrically connected to the second fixed electrode 52. The first dummy electrode 60 and the fourth dummy electrode 66 are connected to each other. The first wiring 70 includes a metal portion 70a, a silicon portion 70b, and a bump portion 70c.

The physical quantity sensor 300 can have the same effect as the physical quantity sensor 200 described above.

In the physical quantity sensor 300, two movable bodies 20 are provided. Therefore, in the physical quantity sensor 300, even if an acceleration having a component in the direction of the other axis (X axis and Y axis) other than the Z-axis direction is applied, it is possible to cancel the component in the direction of the other axis by differential detection. Therefore, in the physical quantity sensor 300, the acceleration in the Z-axis direction can be detected more accurately.

Although not illustrated, the third fixed electrode 54 may be electrically connected to the first fixed electrode 50 instead of the second fixed electrode 52.

Although not shown, the third fixed electrode 54 and the fourth dummy electrode 66 of the first structure 301 are provided on the +X-axis direction side of the second fixed electrode 52 of the first structure 301, and the third fixed electrode 54 and the fourth dummy electrode 66 of the second structure 302 may be provided on the −X-axis direction side of the first fixed electrode 50 of the second structure 302. In this case, the third fixed electrode 54 of the first structure 301, and the third fixed electrode 54 of the second structure 302 may be provided integrally and may constitute a common third fixed electrode 54. The fourth dummy electrode 66 of the first structure 301 and the fourth dummy electrode 66 of the second structure 302 are integrally provided and may constitute a common fourth dummy electrode 66.

Although not shown, the structures 301 and 302 may be arranged in the Y-axis direction instead of the X-axis direction.

3.2. Physical Quantity Sensor Manufacturing Method

Next, a manufacturing method of the physical quantity sensor 300 according to the third embodiment will be described. The manufacturing method of the physical quantity sensor 300 according to the third embodiment is basically the same as the manufacturing method of the physical quantity sensor 200 according to the second embodiment described above, except that the silicon portion 70b and the bump portion 70c are formed. Therefore, a detailed description thereof will be omitted.

4. Fourth Embodiment

Figure 33:
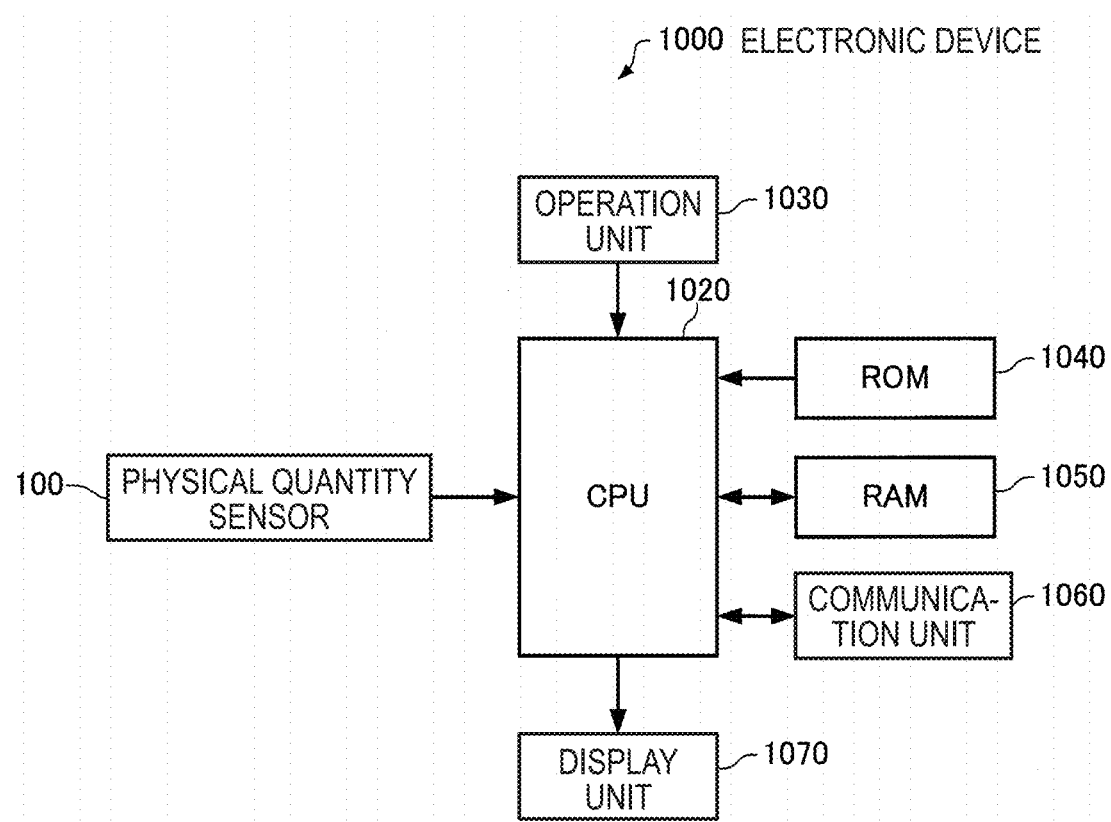
FIG. 33 is a functional block diagram of an electronic device according to a fourth embodiment.

Next, an electronic device according to a fourth embodiment will be described with reference to the drawings. FIG. 33 is a functional block diagram of the electronic device 1000 according to the fourth embodiment.

The electronic device 1000 includes the physical quantity sensor according to the invention. Hereinafter, a case where the physical quantity sensor 100 is included as a physical quantity sensor according to the invention will be described.

The electronic device 1000 is configured to further include an arithmetic processing unit (CPU) 1020, an operation unit 1030, a Read Only Memory (ROM) 1040, a Random Access Memory (RAM) 1050, a communication unit 1060, and a display unit 1070. It is to be noted that the electronic device according to the present embodiment may be configured in such a manner that a part of the constituent elements (respective portions) in FIG. 33 is omitted or changed, or other constituent elements are added.

The arithmetic processing unit 1020 performs various calculation processes and control processes according to a program stored in the ROM 1040 or the like. Specifically, the arithmetic processing unit 1020 performs various processes according to the output signal of the physical quantity sensor 100, or the operation signal from the operation unit 1030, a process of controlling the communication unit 1060 for data communication with an external device, a process of transmitting a display signal for displaying various types of information on the display unit 1070, and the like.

The operation unit 1030 is an input device including an operation key, a button switch, and the like, and outputs an operation signal corresponding to an operation by a user to the arithmetic processing unit 1020.

The ROM 1040 stores programs, data, and the like for the arithmetic processing unit 1020 to perform various calculation processes and control processes.

The RAM 1050 is used as a work area of the arithmetic processing unit 1020 and temporarily stores programs and data read from the ROM 1040, data input from the physical quantity sensor 100, data input from the operation unit 1030, a calculation result obtained by the arithmetic processing unit 1020 executing various programs according to the instruction, and the like.

The communication unit 1060 performs various controls for establishing data communication between the arithmetic processing unit 1020 and the external device.

The display unit 1070 is a display device composed of a liquid crystal display (LCD) or the like, and displays various types of information based on a display signal input from the arithmetic processing unit 1020. A touch panel functioning as the operation unit 1030 may be provided in the display unit 1070.

Various electronic devices are conceivable as such an electronic device 1000, and examples include a personal computer (for example, a mobile type personal computer, a laptop type personal computer, a tablet type personal computer), a mobile terminal such as a smart phone and a mobile phone, a digital still camera, an inkjet type discharge device (for example, an ink jet printer), a storage area network device such as a router and a switch, a local area network device, a mobile terminal base station device, a television, a video camera, a video recorder, a car navigation device, a real time clock device, a pager, an electronic diary (with a communication function), an electronic dictionary, a calculator, an electronic game machine, a game controller, a word processor, a work station, a videophone, a security TV monitor, electronic binoculars, a POS terminal, medical equipment (for example, an electronic clinical thermometer, a blood pressure monitor, a blood glucose meter, an electrocardiogram measuring device, an ultrasonic diagnostic device, an electronic endoscope), a fish finder, various measuring instruments, meters and gauges (for example, instruments of a vehicle, an aircraft, and a ship), a flight simulator, a head mounted display, a motion trace, a motion tracking, a motion controller, a pedestrian position azimuth measurement (PDR), and the like.

Figure 34:
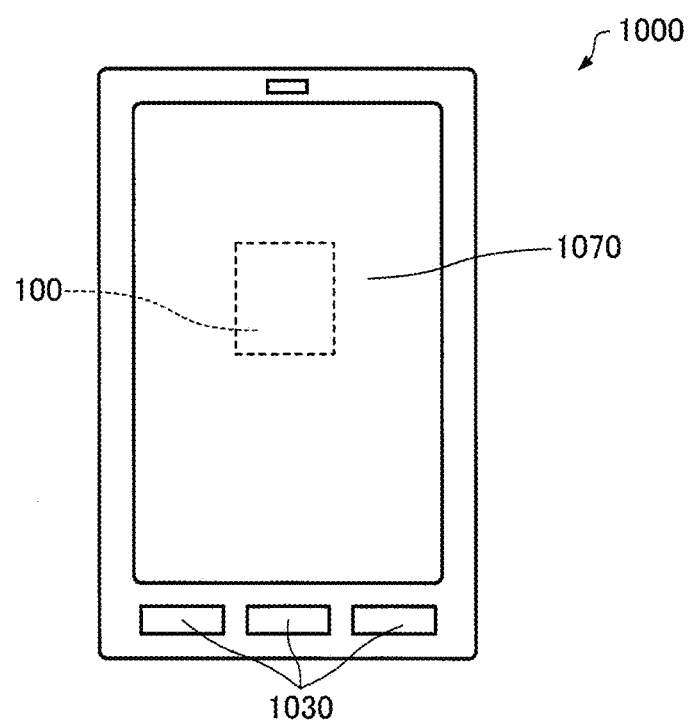
FIG. 34 is a diagram schematically illustrating an appearance of a smartphone which is an example of the electronic device according to the fourth embodiment.

FIG. 34 is a diagram illustrating an example of an external appearance of a smartphone which is an example of the electronic device 1000. A smartphone which is the electronic device 1000 includes a button as an operation unit 1030 and an LCD as the display unit 1070.

Figure 35:
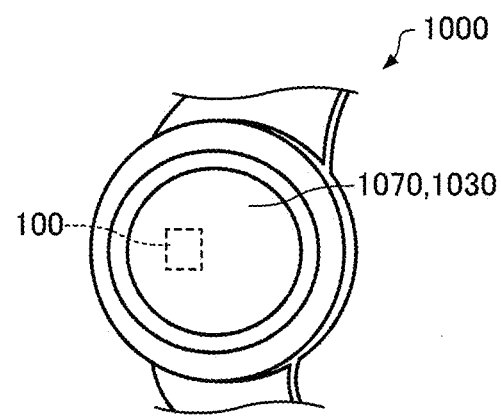
FIG. 35 is a diagram schematically illustrating an appearance of a wearable device which is an example of the electronic device according to the fourth embodiment.

FIG. 35 is a diagram illustrating an example of an appearance of a wrist-worn portable device (wearable device) which is an example of the electronic device 1000. The wearable device which is the electronic device 1000 includes an LCD as the display unit 1070. A touch panel functioning as the operation unit 1030 may be provided in the display unit 1070.

Further, the portable device, which is the electronic device 1000, includes a position sensor such as a Global Positioning System (GPS) receiver, for example, and can measure a moving distance and a moving trajectory of the user.

5. Fifth Embodiment

Figure 36:
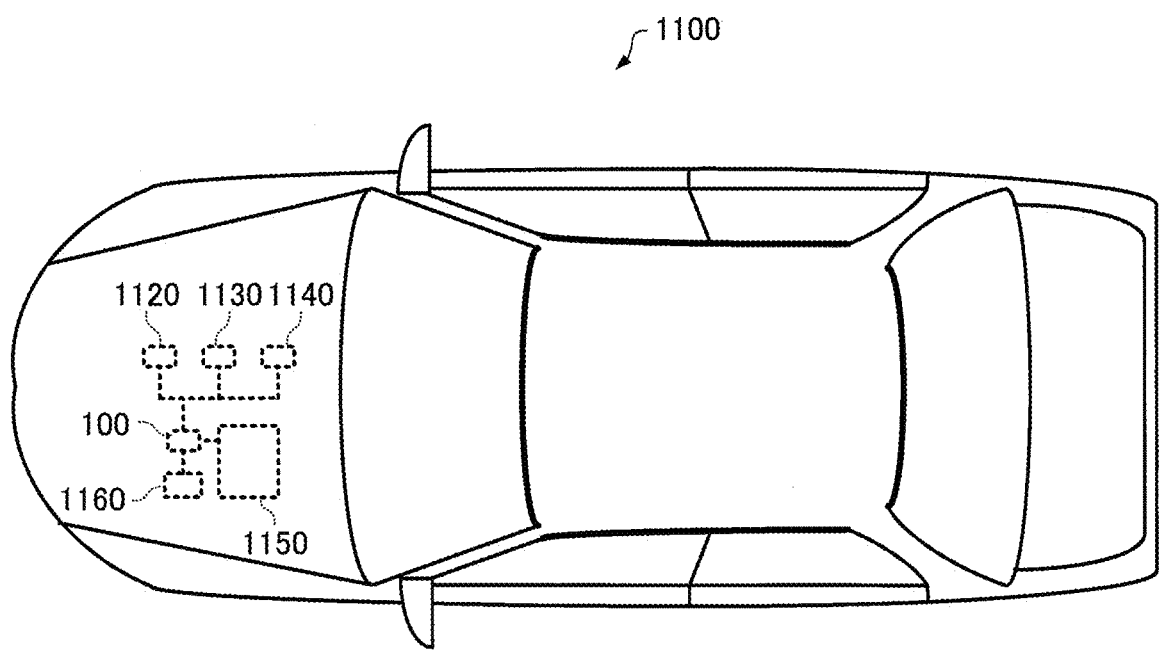
FIG. 36 is a plan view schematically illustrating a vehicle according to a fifth embodiment.

Next, a vehicle according to the fifth embodiment will be described with reference to the drawings. FIG. 36 is a perspective view schematically illustrating a car, as the vehicle 1100 according to the fifth embodiment.

The vehicle according to the fifth embodiment includes the physical quantity sensor according to the invention. Hereinafter, a vehicle including the physical quantity sensor 100 will be described as a physical quantity sensor according to the invention.

The vehicle 1100 according to the fifth embodiment is configured to further include a controller 1120 that controls an engine system, a brake system, a keyless entry system, and the like, a controller 1130, a controller 1140, a battery 1150, and a backup battery 1160. Note that, in the vehicle 1100 according to the fifth embodiment, a part of the constituent elements (each unit) illustrated in FIG. 36 may be omitted or changed, or other constituent elements may be added.

As such a vehicle 1100, various vehicles are conceivable, examples of which include an automobile (including an electric car), an aircraft such as a jet aircraft and a helicopter, a ship, a rocket, an artificial satellite, and the like.

Each of the above-described embodiments and modification examples is examples, and the invention is not limited thereto. For example, the respective embodiments and the respective modification examples can be appropriately combined.

Further, the invention includes substantially the same configuration (for example, a configuration having the same function, method, and result, or a configuration having the same purpose and effect) as the configuration described in the embodiment. Further, the invention includes configurations in which the non-essential parts of the configuration described in the embodiment are replaced. Further, the invention includes configurations that achieve the same effect as the configuration described in the embodiment or configurations that can achieve the same object. Further, the invention includes configurations in which a well-known technology is added to the configuration described in the embodiment.

The entire disclosure of Japanese Patent Application No. 2017-061700 filed on Mar. 27, 2017 is expressly incorporated by reference herein.

What is claimed is:

1. A physical quantity sensor manufacturing method comprising:
forming a first fixed electrode and a second fixed electrode on a substrate, and forming a dummy electrode so as to be adjacent to the first fixed electrode; and
forming a movable body which overlaps with the first fixed electrode and the second fixed electrode in plan view, is at the same potential as the dummy electrode, and displaces in a direction intersecting with a main surface of the substrate according to a physical quantity, and wherein the electrode forming includes forming a first mask layer on the substrate;

forming a first electrode material layer, by forming a first conductive layer on the substrate and on the first mask layer, and removing the first mask layer;

forming a second conductive layer on the substrate and on the first electrode material layer;

forming a second mask layer, by forming a mask material layer on the second conductive layer and removing a part of a section of the mask material layer not overlapping the first electrode material layer in plan view; and forming a second electrode material layer by etching the second conductive layer by using the second mask layer as a mask so that the second conductive layer is provided on the first electrode material layer and on the substrate.

2. The physical quantity sensor manufacturing method according to claim 1, wherein the electrode forming includes forming an insulating layer between the first fixed electrode and the dummy electrode.

3. The physical quantity sensor manufacturing method according to claim 1, wherein a material of the first electrode material layer is platinum.

4. The physical quantity sensor manufacturing method according to claim 1, wherein a material of the second electrode material layer is titanium tungsten.

5. The physical quantity sensor manufacturing method according to claim 1, further comprising:

forming an adhesive layer on the substrate before the electrode forming, wherein in the forming the first electrode material layer, the first conductive layer is formed on the adhesive layer.

* * * * *